United States Patent
Singhal et al.

(10) Patent No.: US 12,371,781 B2
(45) Date of Patent: Jul. 29, 2025

(54) IN SITU PROTECTIVE COATING OF CHAMBER COMPONENTS FOR SEMICONDUCTOR PROCESSING

(71) Applicant: Lam Research Corporation, Fremont, CA (US)

(72) Inventors: Akhil Singhal, Beaverton, OR (US); David Charles Smith, Lake Oswego, OR (US); Karl Frederick Leeser, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 57 days.

(21) Appl. No.: 17/309,032

(22) PCT Filed: Oct. 8, 2019

(86) PCT No.: PCT/US2019/055264
§ 371 (c)(1),
(2) Date: Apr. 15, 2021

(87) PCT Pub. No.: WO2020/081303
PCT Pub. Date: Apr. 23, 2020

(65) Prior Publication Data
US 2021/0340670 A1    Nov. 4, 2021

Related U.S. Application Data

(60) Provisional application No. 62/748,194, filed on Oct. 19, 2018.

(51) Int. Cl.
*C23C 16/44* (2006.01)
*C23C 16/34* (2006.01)
(Continued)

(52) U.S. Cl.
CPC ........ *C23C 16/4404* (2013.01); *C23C 16/345* (2013.01); *C23C 16/402* (2013.01);
(Continued)

(58) Field of Classification Search
None
See application file for complete search history.

(56) References Cited

U.S. PATENT DOCUMENTS

| | | | |
|---|---|---|---|
| 4,410,395 A | 10/1983 | Weaver et al. | |
| 4,892,753 A | 1/1990 | Wang et al. | |

(Continued)

FOREIGN PATENT DOCUMENTS

| | | |
|---|---|---|
| CN | 1798867 A | 7/2006 |
| CN | 1883037 A | 12/2006 |

(Continued)

OTHER PUBLICATIONS

Office Action dated Dec. 10, 2015 issued in U.S. Appl. No. 14/089,653.
(Continued)

*Primary Examiner* — Mandy C Louie
(74) *Attorney, Agent, or Firm* — Weaver Austin Villeneuve & Sampson LLP

(57) ABSTRACT

An in situ protective coating is deposited on surfaces of chamber components of a reaction chamber at high temperatures. The in situ protective coating may be deposited at a temperature greater than about 200° C. to provide a high quality coating that is resistant to certain types of halogen chemistries, such as fluorine-based species, chlorine-based species, bromine-based species, or iodine-based species. Subsequent coatings or layers may be deposited on the in situ protective coating having different etch selectivities than the underlying in situ protective coating. The in situ protective coating may be deposited throughout the reaction cham- (Continued)

ber to deposit on surfaces of the chamber components, including on chamber walls.

15 Claims, 6 Drawing Sheets

(51) Int. Cl.
  *C23C 16/40* (2006.01)
  *C23C 16/455* (2006.01)
  *C23C 16/52* (2006.01)
  *H01J 37/32* (2006.01)

(52) U.S. Cl.
  CPC .......... *C23C 16/403* (2013.01); *C23C 16/405* (2013.01); *C23C 16/45536* (2013.01); *C23C 16/52* (2013.01); *C23C 16/45544* (2013.01); *H01J 37/32477* (2013.01)

(56) References Cited

U.S. PATENT DOCUMENTS

| | | | |
|---|---|---|---|
| 5,154,810 A | 10/1992 | Kamerling et al. | |
| 5,443,686 A | 8/1995 | Jones et al. | |
| 5,510,297 A | 4/1996 | Telford et al. | |
| 5,605,859 A | 2/1997 | Lee | |
| 5,647,953 A | 7/1997 | Williams et al. | |
| 5,654,475 A | 8/1997 | Vassiliou et al. | |
| 5,811,356 A | 9/1998 | Murugesh et al. | |
| 5,824,375 A | 10/1998 | Gupta | |
| 5,902,135 A | 5/1999 | Schulze | |
| 5,970,383 A | 10/1999 | Lee | |
| 6,071,573 A | 6/2000 | Koemtzopoulos et al. | |
| 6,121,161 A | 9/2000 | Rossman et al. | |
| 6,121,164 A | 9/2000 | Yieh et al. | |
| 6,162,323 A | 12/2000 | Koshimizu | |
| 6,223,685 B1 | 5/2001 | Gupta et al. | |
| 6,416,577 B1 | 7/2002 | Suntoloa et al. | |
| 6,449,521 B1 | 9/2002 | Gupta | |
| 6,475,336 B1 | 11/2002 | Hubacek | |
| 6,534,380 B1 | 3/2003 | Yamauchi et al. | |
| 6,626,186 B1 | 9/2003 | Hillman et al. | |
| 6,626,188 B2 | 9/2003 | Fitzsimmons et al. | |
| 6,696,362 B2 | 2/2004 | Rossman et al. | |
| 6,749,098 B2 | 6/2004 | Roier et al. | |
| 6,776,873 B1 | 8/2004 | Sun et al. | |
| 6,815,007 B1 | 11/2004 | Yoo et al. | |
| 6,818,570 B2 | 11/2004 | Tsuji et al. | |
| 6,819,969 B2 | 11/2004 | Lee et al. | |
| 6,933,254 B2 | 8/2005 | Morita et al. | |
| 7,118,779 B2 | 10/2006 | Verghese et al. | |
| 7,138,332 B2 | 11/2006 | Goundar | |
| 7,183,177 B2 | 2/2007 | Al-Bayati et al. | |
| 7,204,913 B1 | 4/2007 | Singh et al. | |
| 7,232,492 B2 | 6/2007 | Won et al. | |
| 7,241,690 B2 | 7/2007 | Pavone et al. | |
| 7,288,284 B2 | 10/2007 | Li et al. | |
| 7,601,639 B2 | 10/2009 | Pavone et al. | |
| 7,704,894 B1 | 4/2010 | Henri et al. | |
| 7,767,584 B1 | 8/2010 | Singh et al. | |
| 7,799,135 B2 | 9/2010 | Verghese et al. | |
| 7,914,847 B2 | 3/2011 | Verghese et al. | |
| 7,923,376 B1 | 4/2011 | Dhas et al. | |
| 8,017,527 B1 | 9/2011 | Dhas et al. | |
| 8,088,296 B2 | 1/2012 | Yamazake | |
| 8,101,531 B1 | 1/2012 | Li et al. | |
| 8,163,087 B2 | 4/2012 | Faguet et al. | |
| 8,206,829 B2 | 6/2012 | Sun et al. | |
| 8,293,658 B2 | 10/2012 | Shero et al. | |
| 9,034,142 B2 | 5/2015 | Bartlett et al. | |
| 9,228,259 B2 | 1/2016 | Haukka et al. | |
| 9,328,416 B2 | 5/2016 | Dhas et al. | |
| 9,493,875 B2 | 11/2016 | Um | |
| 9,601,693 B1 | 3/2017 | Henri et al. | |
| 9,745,658 B2 | 8/2017 | Kang et al. | |
| 9,803,277 B1* | 10/2017 | Longrie | H01L 21/76883 |
| 9,805,974 B1 | 10/2017 | Chen et al. | |
| 9,828,672 B2 | 11/2017 | Varadarajan et al. | |
| 9,850,573 B1 | 12/2017 | Sun | |
| 9,869,020 B2 | 1/2018 | Malinen et al. | |
| 10,023,956 B2 | 7/2018 | Cui et al. | |
| 10,134,569 B1 | 11/2018 | Albarede et al. | |
| 10,211,099 B2 | 2/2019 | Wang et al. | |
| 10,704,141 B2 | 7/2020 | Malik et al. | |
| 10,745,805 B2 | 8/2020 | Firouzdor et al. | |
| 10,760,158 B2 | 9/2020 | Shanbhag et al. | |
| 11,365,479 B2 | 6/2022 | Shanbhag et al. | |
| 11,761,079 B2 | 9/2023 | Lai et al. | |
| 11,920,239 B2 | 3/2024 | Varadarajan et al. | |
| 12,227,837 B2 | 2/2025 | Shanbhag et al. | |
| 2001/0006835 A1 | 7/2001 | Kim et al. | |
| 2001/0007244 A1 | 7/2001 | Matsuse | |
| 2002/0073922 A1 | 6/2002 | Frankel et al. | |
| 2002/0076490 A1 | 6/2002 | Chiang et al. | |
| 2002/0092763 A1 | 7/2002 | Denning et al. | |
| 2002/0192359 A1 | 12/2002 | Johnson | |
| 2003/0013314 A1 | 1/2003 | Ying et al. | |
| 2003/0031793 A1 | 2/2003 | Chang et al. | |
| 2003/0091753 A1 | 5/2003 | Han et al. | |
| 2003/0127049 A1 | 7/2003 | Han et al. | |
| 2003/0159657 A1 | 8/2003 | Kaushal et al. | |
| 2003/0203123 A1 | 10/2003 | Shang et al. | |
| 2004/0023516 A1 | 2/2004 | Londergan et al. | |
| 2004/0025903 A1* | 2/2004 | Howard | B08B 7/00 134/1.1 |
| 2004/0045503 A1 | 3/2004 | Lee et al. | |
| 2004/0134427 A1 | 7/2004 | Derderian et al. | |
| 2004/0149386 A1 | 8/2004 | Numasawa et al. | |
| 2004/0182833 A1 | 9/2004 | Fink | |
| 2005/0068519 A1 | 3/2005 | O'Meara et al. | |
| 2005/0130427 A1 | 6/2005 | Won et al. | |
| 2005/0214455 A1 | 9/2005 | Li et al. | |
| 2005/0221001 A1* | 10/2005 | Joe | C23C 16/4404 427/248.1 |
| 2005/0221020 A1 | 10/2005 | Fukiage | |
| 2005/0227499 A1 | 10/2005 | Park et al. | |
| 2006/0046470 A1 | 3/2006 | Becknell et al. | |
| 2006/0093756 A1 | 5/2006 | Rajagopalan et al. | |
| 2006/0189171 A1 | 8/2006 | Chua et al. | |
| 2006/0269691 A1 | 11/2006 | Saki | |
| 2006/0280868 A1 | 12/2006 | Kato et al. | |
| 2007/0037348 A1 | 2/2007 | Shin et al. | |
| 2007/0056843 A1 | 3/2007 | Ye et al. | |
| 2007/0111458 A1 | 5/2007 | Sato et al. | |
| 2007/0201016 A1 | 8/2007 | Song et al. | |
| 2007/0269992 A1 | 11/2007 | Yang et al. | |
| 2007/0281083 A1 | 12/2007 | Lakshmanan et al. | |
| 2008/0094775 A1 | 4/2008 | Sneh et al. | |
| 2008/0110760 A1 | 5/2008 | Han et al. | |
| 2008/0118663 A1 | 5/2008 | Choi et al. | |
| 2008/0124901 A1 | 5/2008 | Jyogo et al. | |
| 2008/0149032 A1 | 6/2008 | Jung | |
| 2008/0178803 A1 | 7/2008 | Collins et al. | |
| 2008/0066677 A1 | 8/2008 | Morozumi et al. | |
| 2008/0202688 A1 | 8/2008 | Wu et al. | |
| 2008/0286982 A1 | 11/2008 | Li et al. | |
| 2008/0302281 A1 | 12/2008 | Bernard et al. | |
| 2009/0041952 A1 | 2/2009 | Yoon et al. | |
| 2009/0197401 A1 | 8/2009 | Li et al. | |
| 2009/0200269 A1 | 8/2009 | Kadkhodayan et al. | |
| 2009/0242511 A1 | 10/2009 | Shimazu et al. | |
| 2009/0253269 A1 | 10/2009 | Tsuneda | |
| 2009/0260571 A1 | 10/2009 | Ostrowski et al. | |
| 2009/0278116 A1 | 11/2009 | Yamate | |
| 2009/0294881 A1 | 12/2009 | Murata et al. | |
| 2009/0308840 A1 | 12/2009 | Kohno et al. | |
| 2009/0325391 A1 | 12/2009 | De Vusser et al. | |
| 2010/0048028 A1 | 2/2010 | Rasheed et al. | |
| 2010/0104760 A1 | 4/2010 | Matsui et al. | |
| 2010/0186512 A1 | 7/2010 | Goto et al. | |
| 2010/0190352 A1 | 7/2010 | Jaiswal | |
| 2010/0243192 A1 | 9/2010 | Balasubramanian et al. | |
| 2011/0045676 A1 | 2/2011 | Park et al. | |
| 2011/0056626 A1 | 3/2011 | Brown et al. | |

(56) References Cited

U.S. PATENT DOCUMENTS

| | | |
|---|---|---|
| 2011/0070380 A1 | 3/2011 | Shero et al. |
| 2011/0151142 A1 | 6/2011 | Seamons et al. |
| 2011/0230008 A1 | 9/2011 | Lakshmanan et al. |
| 2011/0256726 A1 | 10/2011 | LaVoie et al. |
| 2011/0262650 A1 | 10/2011 | Lee |
| 2011/0315186 A1 | 12/2011 | Gee et al. |
| 2012/0097330 A1 | 4/2012 | Iyengar et al. |
| 2012/0122319 A1 | 5/2012 | Shimizu |
| 2012/0181166 A1 | 7/2012 | Luo et al. |
| 2012/0237693 A1 | 9/2012 | Jackson et al. |
| 2012/0251737 A1 | 10/2012 | Osaki et al. |
| 2013/0012030 A1 | 1/2013 | Lakshmanan et al. |
| 2013/0014896 A1 | 1/2013 | Shoji et al. |
| 2013/0017685 A1 | 1/2013 | Akae et al. |
| 2013/0064973 A1 | 3/2013 | Chen et al. |
| 2013/0089988 A1 | 4/2013 | Wang et al. |
| 2013/0122711 A1* | 5/2013 | Marakhtanov .... H01J 37/32165 438/711 |
| 2013/0135155 A1 | 5/2013 | Zhang |
| 2013/0302980 A1 | 11/2013 | Chandrashekar et al. |
| 2013/0330935 A1 | 12/2013 | Varadarajan |
| 2014/0065835 A1 | 3/2014 | Kadkhodayan et al. |
| 2014/0106573 A1 | 4/2014 | Terasaki et al. |
| 2014/0120738 A1 | 5/2014 | Jung et al. |
| 2014/0127852 A1 | 5/2014 | De Souza et al. |
| 2014/0158674 A1 | 6/2014 | Moffatt et al. |
| 2014/0184705 A1 | 7/2014 | Wakamatsu et al. |
| 2014/0209026 A1 | 7/2014 | LaVoie et al. |
| 2014/0272184 A1 | 9/2014 | Sreekala et al. |
| 2014/0295670 A1 | 10/2014 | Shih et al. |
| 2014/0302254 A1 | 10/2014 | Sang et al. |
| 2014/0319544 A1 | 10/2014 | Hwang |
| 2014/0356549 A1 | 12/2014 | Varadarajan |
| 2015/0017335 A1 | 1/2015 | Werner |
| 2015/0147482 A1* | 5/2015 | Kang ................. C23C 16/45525 427/535 |
| 2015/0203967 A1* | 7/2015 | Dhas ..................... C23C 16/401 |
| 2015/0218700 A1 | 8/2015 | Nguyen et al. |
| 2015/0221553 A1 | 8/2015 | Ouye |
| 2015/0228496 A1 | 8/2015 | Nakano |
| 2015/0270107 A1 | 9/2015 | Zhao et al. |
| 2015/0307982 A1 | 10/2015 | Firouzdor et al. |
| 2015/0345017 A1 | 12/2015 | Chang et al. |
| 2015/0361547 A1 | 12/2015 | Lin et al. |
| 2016/0016286 A1 | 1/2016 | Suh et al. |
| 2016/0099147 A1 | 4/2016 | Kulshreshtha et al. |
| 2016/0281230 A1 | 9/2016 | Varadarajan et al. |
| 2016/0300713 A1 | 10/2016 | Cui et al. |
| 2016/0329206 A1 | 11/2016 | Kumar et al. |
| 2016/0375515 A1 | 12/2016 | Xu et al. |
| 2017/0152968 A1 | 6/2017 | Raj et al. |
| 2017/0204516 A1 | 7/2017 | Nguyen et al. |
| 2017/0301522 A1 | 10/2017 | Sun et al. |
| 2017/0314125 A1 | 11/2017 | Fenwick et al. |
| 2017/0314128 A1 | 11/2017 | Kang et al. |
| 2017/0323772 A1 | 11/2017 | Fenwick et al. |
| 2018/0016678 A1 | 1/2018 | Fenwick et al. |
| 2018/0044791 A1 | 2/2018 | Varadarajan et al. |
| 2018/0057939 A1 | 3/2018 | Yun et al. |
| 2018/0127864 A1 | 5/2018 | Latchford et al. |
| 2018/0174901 A1 | 6/2018 | Wang et al. |
| 2018/0202047 A1 | 7/2018 | Lin et al. |
| 2018/0265972 A1 | 9/2018 | Firouzdor et al. |
| 2018/0265973 A1 | 9/2018 | Firouzdor et al. |
| 2018/0337026 A1 | 11/2018 | Firouzdor et al. |
| 2018/0347037 A1 | 12/2018 | Zhai et al. |
| 2019/0078206 A1 | 3/2019 | Wu et al. |
| 2019/0131113 A1 | 5/2019 | Fenwick et al. |
| 2019/0185999 A1 | 6/2019 | Shanbhag et al. |
| 2019/0194803 A1* | 6/2019 | Kato ................. H01L 21/68757 |
| 2019/0271076 A1 | 9/2019 | Fenwick et al. |
| 2020/0058469 A1* | 2/2020 | Ranjan ............... H01L 21/3065 |
| 2020/0347497 A1 | 11/2020 | Shanbhag et al. |
| 2021/0071300 A1 | 3/2021 | Bajaj et al. |
| 2021/0164097 A1 | 6/2021 | Lai et al. |
| 2022/0145459 A1 | 5/2022 | Varadarajan et al. |
| 2022/0275504 A1 | 9/2022 | Shanbhag et al. |
| 2023/0002891 A1 | 1/2023 | Shanbhag et al. |
| 2023/0383401 A1 | 11/2023 | Lai et al. |

FOREIGN PATENT DOCUMENTS

| | | |
|---|---|---|
| CN | 101053063 A | 10/2007 |
| CN | 101312126 A | 11/2008 |
| CN | 101313085 A | 11/2008 |
| CN | 101764044 A | 6/2010 |
| CN | 102892922 A | 1/2013 |
| CN | 103098174 A | 5/2013 |
| CN | 103219227 A | 7/2013 |
| CN | 103243310 A | 8/2013 |
| CN | 104272440 A | 1/2015 |
| CN | 104651807 A | 5/2015 |
| CN | 105378900 A | 3/2016 |
| CN | 106169420 A | 11/2016 |
| CN | 106270863 A | 1/2017 |
| CN | 107313027 A | 11/2017 |
| JP | S58151031 A | 9/1983 |
| JP | H07326581 A | 12/1995 |
| JP | H0822980 A | 1/1996 |
| JP | H0871408 A | 3/1996 |
| JP | H09330885 A | 12/1997 |
| JP | 2001123271 A | 5/2001 |
| JP | 2001271170 A | 10/2001 |
| JP | 2003-224076 A | 8/2003 |
| JP | 2003297817 A | 10/2003 |
| JP | 2004511901 A | 4/2004 |
| JP | 2005-085878 A | 3/2005 |
| JP | 2006100705 A | 4/2006 |
| JP | 2007049162 A | 2/2007 |
| JP | 2008187179 A | 8/2008 |
| JP | 2009-094340 A | 4/2009 |
| JP | 2009-147373 A | 7/2009 |
| JP | 2009-188198 A | 8/2009 |
| JP | 2009263764 A | 11/2009 |
| JP | 2010103443 A | 5/2010 |
| JP | 2010147238 A | 7/2010 |
| JP | 2011-020995 A | 3/2011 |
| JP | 2011124274 A | 6/2011 |
| JP | 2011124472 A | 6/2011 |
| JP | 2011-187934 A | 9/2011 |
| JP | 2012-216696 A | 11/2012 |
| JP | 2012216631 A | 11/2012 |
| JP | 2013179321 A | 9/2013 |
| JP | 2014125653 A | 7/2014 |
| JP | 2014152304 A | 12/2014 |
| JP | 2015122486 A | 7/2015 |
| JP | 2016051864 A | 4/2016 |
| JP | 2016216817 A | 12/2016 |
| JP | 2017512375 A | 5/2017 |
| JP | 2017514991 A | 6/2017 |
| JP | 2017199907 A | 11/2017 |
| KR | 19980018744 A | 6/1998 |
| KR | 100382370 B1 | 5/2003 |
| KR | 20040022056 A | 3/2004 |
| KR | 20060055138 A | 5/2006 |
| KR | 20070030596 A | 3/2007 |
| KR | 20070085564 A | 8/2007 |
| KR | 20080071493 A | 8/2008 |
| KR | 20080101740 A | 11/2008 |
| KR | 20080105539 A | 12/2008 |
| KR | 20090016403 A | 2/2009 |
| KR | 20090053823 A | 5/2009 |
| KR | 20100120199 A | 11/2010 |
| KR | 20110053360 A | 5/2011 |
| KR | 20120057570 A | 6/2012 |
| KR | 20130005307 A | 1/2013 |
| KR | 20130055582 A | 5/2013 |
| KR | 20140034115 A | 3/2014 |
| KR | 20140141686 A | 12/2014 |
| KR | 20150060583 A | 6/2015 |
| KR | 20150086197 A | 7/2015 |
| KR | 20150143233 A | 12/2015 |
| KR | 20160115761 A | 10/2016 |
| KR | 20170122674 A | 11/2017 |

(56) References Cited

FOREIGN PATENT DOCUMENTS

| | | |
|---|---|---|
| TW | 200535277 A | 11/2005 |
| TW | 200830942 A | 7/2008 |
| TW | 200917363 A | 4/2009 |
| TW | 201405707 A | 2/2014 |
| TW | 201405781 A | 2/2014 |
| TW | 201425633 A | 7/2014 |
| TW | 201626503 A | 7/2016 |
| TW | I609455 B | 12/2017 |
| WO | WO-2006054854 A1 | 5/2006 |
| WO | WO 2007/027350 A2 | 3/2007 |
| WO | WO 2009/085117 A2 | 7/2009 |
| WO | WO-2013043330 A1 | 3/2013 |
| WO | WO 2011/111498 A1 | 6/2013 |
| WO | WO 2014/137532 A1 | 9/2014 |
| WO | WO-2016131024 A1 | 8/2016 |
| WO | WO-2021029970 A1 | 2/2021 |
| WO | WO-2021050168 A1 | 3/2021 |

OTHER PUBLICATIONS

Office Action dated May 13, 2016 issued in U.S. Appl. No. 14/089,653.
Final Office Action dated Oct. 28, 2016 issued in U.S. Appl. No. 14/089,653.
Notice of Allowance dated Jan. 23, 2017 issued in U.S. Appl. No. 14/089,653.
Notice of Allowance dated Jun. 1, 2017 issued in U.S. Appl. No. 14/089,653.
Office Action dated Mar. 14, 2018 issued in U.S. Appl. No. 15/650,731.
Final Office Action dated Aug. 16, 2018 issued in U.S. Appl. No. 15/650,731.
Office Action, dated Aug. 17, 2015, issued in U.S. Appl. No. 14/158,536.
Notice of Allowance, dated Jan. 11, 2016, issued in U.S. Appl. No. 14/158,536.
Office Action, dated Nov. 18, 2016, issued in U.S. Appl. No. 14/712,167.
Final Office Action, dated Apr. 20, 2017, issued in U.S. Appl. No. 14/712,167.
Notice of Allowance, dated Aug. 18, 2017, issued in U.S. Appl. No. 14/712,167.
Office Action, dated Feb. 28, 2020, issued in U.S. Appl. No. 15/794,786.
Final Office Action, dated Jul. 6, 2020, issued in U.S. Appl. No. 15/794,786.
Office Action, dated Jan. 29, 2021, issued in U.S. Appl. No. 15/794,786.
Office Action, dated Mar. 24, 2017, issued in U.S. Appl. No. 14/683,022.
Final Office Action, dated Nov. 3, 2017, issued in U.S. Appl. No. 14/683,022.
Notice of Allowance, dated Mar. 22, 2018, issued in U.S. Appl. No. 14/683,022.
Office Action, dated Nov. 20, 2017, issued in U.S. Appl. No. 15/384,175.
Final Office Action, dated Jun. 18, 2018, issued in U.S. Appl. No. 15/384,175.
Notice of Allowance, dated Oct. 3, 2018, issued in U.S. Appl. No. 15/384,175.
Office Action, dated Oct. 8, 2019, issued in U.S. Appl. No. 15/954,454.
Final Office Action, dated Jan. 15, 2020, issued in U.S. Appl. No. 15/954,454.
Notice of Allowance, dated Apr. 22, 2020, issued in U.S. Appl. No. 15/954,454.
Chinese First Office Action, dated Sep. 5, 2016, issued in Application No. CN 201410686823.4.
Chinese Second Office Action, dated May 8, 2017, issued in Application No. CN 201410686823.4.
Japanese First Office Action, dated Jan. 8, 2019, issued in Application No. JP 2014-233410.
Japanese Second Office Action, dated Nov. 19, 2019, issued in Application No. JP 2014-233410.
Japanese Third Office Action, dated Jul. 3, 2020, issued in Application No. JP 2014-233410.
Taiwanese Notice of Allowance dated Aug. 10, 2018, issued in Application No. TW 104101422.
Chinese First Office Action, dated Mar. 20, 2018 issued in Application No. CN 201610181756.X.
Chinese Second Office Action, dated Jan. 28, 2019 issued in Application No. CN 201610181756.X.
Chinese Third Office Action, dated Aug. 2, 2019 issued in Application No. CN 201610181756.X.
Chinese Notice of Allowance, dated Mar. 3, 2020 issued in Application No. CN 201610181756.X.
Japanese First Office Action, dated Mar. 10, 2020 issued in Application No. JP 2016-054587.
Japanese Second Office Action, dated Dec. 15, 2020 issued in Application No. JP 2016-054587.
Taiwanese First Office Action dated Oct. 16, 2019 issued in Application No. TW 105109337.
Taiwanese Notice of Allowance dated Apr. 17, 2020 issued in Application No. TW 105109337.
Taiwanese First Office Action dated Apr. 30, 2018 issued in Application No. TW 103140644.
Chinese First Office Action dated Jun. 3, 2019 issued in Application No. CN 201711372325.2.
Chinese Second Office Action dated May 7, 2020 issued in Application No. CN 201711372325.2.
Chinese Third Office Action, dated Dec. 1, 2020 issued in Application No. CN 201711372325.2.
International Search Report dated Mar. 22, 2019 issued in Application No. PCT/US2018/064090.
International Preliminary Report and Patentability dated Jun. 25, 2020 issued in PCT/US2018/064090.
International Search Report dated Feb. 5, 2020 issued in PCT/US2019/055264.
Advanced Energy Industries, Inc. brochure. "Remote Plasma Source Chamber Anodization". 2018, pp. 1-8.
Cunge et al. (2005) "New chamber walls conditioning and cleaning strategies to improve the stability of plasma processes," *Plasma Sources Sci. Technol.* 14:509-609.
Cunge et al. (2005) "Plasma-wall interactions during silicon etching processes in high-density $HBr/Cl_2/O_2$ plasmas," *Plasma Sources Sci. Technol.* 14:S42-S52.
Fotovvati, Behzad, et al., "On Coating Techniques for Surface Protection: A Review" Journal of Manufacturing and Materials Processing, 2019, 3, 28, pp. 1-22.
Juárez et al. (2009) "Low temperature deposition: properties of $SiO_2$ films from TEOS and ozone by APCVD system," XIX Latin American Symposium on Solid State Physics (SLAFES XIX). *Journal of Physics: Conference Series* 167(012020) pp. 1-6.
Kang et al. (Jul./Aug. 2005) "Evaluation of silicon oxide cleaning using $F_2$/Ar remote plasma processing," *J. Vac. Sci. Technol. A* 23(4):911-916.
Kim et al. (1991) "Recombination of O, N, and H Atoms on Silica: Kinetics and Mechanism," *Langmuir*, 7(12):2999-3005.
Kim et al. (2015) "Investigation of Plasma Enhanced Chemical Vapor Deposition Chamber Mismatching by Photoluminescence and Raman Spectroscopy," *ECS Journal of Solid State Science and Technology*, 4(8)P314-P318.
Klimecky et al. (May/Jun. 2003) "Compensation for transient chamber wall condition using real-time plasma density feedback control in an inductively coupled plasma etcher," *Journal Vac. Sci. Technol. A*, 21(3):706-717.
Knoops et al. (2010) "Conformality of Plasma-Assisted ALD: Physical Processes and Modeling," *Journal of The Electrochemical Society*, 157(12):G241-G249.
Lin, Tzu-Ken, et al., Comparison of Erosion Behavior and Particle Contamination in Mass-Production CF4/02 Plasma Chambers Using Y2O3 and YF3 Protective Coatings. Nanomaterials, 2017, 7, 183, pp. 1-9.

(56) References Cited

OTHER PUBLICATIONS

Lin, Tzu-Ken, et al., "Preparation and Characterization of Sprayed-Yttrium Oxyfluoride Corrosion Protective Coating for Plasma Process Chambers" Coatings, 2018, 8, 373, Oct. 22, 2018, pp. 1-8.
Nakagawa, Takahide (May 1991) "Effect of Coating on the Plasma Chamber Wall in RIKEN Electron Cyclotron Resonance Ion Source," *Japanese Journal of Applied Physics*, 30(5B)L930-L932.
Hu, L, et al., "Coating Strategies for Atomic Layer Deposition". Nanotechnology. Jan. 2017, vol. 6, No. 6, pp. 527-547.
International Preliminary Report and Patentability dated Apr. 29, 2021 issued in PCT/US2019/055264.
International Preliminary Report on Patentability dated Jun. 18, 2020 in PCT Application No. PCT/US2018/064304.
International Search Report and Written Opinion dated Apr. 1, 2019, in PCT Application No. PCT/US2018/064304.
Japanese First Office Action, dated Aug. 18, 2021, issued in Application No. JP 2020-185592.
Japanese Office Action dated Feb. 14, 2023 issued in Application No. JP2022-004040 with English translation.
Japanese Third Office Action, dated Sep. 10, 2021 issued in Application No. JP 2016-054587.
JP Office Action dated Feb. 8, 2022, in Application No. JP2020-185592 with English translation.
JP Office Action dated Mar. 28, 2023 in Application No. JP2020-532621 with English translation.
JP Office Action dated Nov. 15, 2022, in Application No. JP2020-532621 with English translation.
Korean First Office Action dated Apr. 16, 2021 issued in Application No. KR 10-2015-0007827.
Korean First Office Action, dated Jul. 1, 2021, issued in Application No. KR 10-2014-0165420.
KR Office Action dated Oct. 14, 2022, in Application No. KR10-2022-7018308, with English Translation.
KR Office Action dated Apr. 14, 2023 in Application No. KR10-2016-0034431 with English translation.
KR Office Action dated Apr. 20, 2022, in Application No. KR10-2022-0020744 with English translation.
KR Office Action dated Aug. 1, 2022, in Application No. 10-2017-0172906 with English translation.
KR Office Action dated Dec. 21, 2021, in Application No. KR1020140165420 with English translation.
KR Office Action dated Feb. 8, 2022, in Application No. 10-2017-0172906 with English translation.
KR Office Action dated Feb. 14, 2023 in Application No. KR10-2023-0013752 with English translation.
KR Office Action dated Feb. 27, 2023, in Application No. KR10-2022-7018308, with English Translation.
KR Office Action dated Jun. 1, 2022, in Application No. KR10-2014-0165420 with English Translation.
KR Office Action dated Jun. 9, 2022, in Application No. KR10-2022-0017172 with English translation.
KR Office Action dated Mar. 10, 2022, in Application No. KR1020220017172 with English translation.
KR Office Action dated Mar. 22, 2023 in Application No. KR10-2016-0042618 with English translation.
KR Office Action dated May 26, 2022, in Application No. KR10-2016-0042618 With English Translation.
KR Office Action dated Nov. 1, 2022, in Application No. 10-2017-0172906 with English translation.
KR Office Action dated Nov. 17, 2021, in Application No. KR1020150007827 with English translation.
KR Office Action dated Nov. 17, 2022, in Application No. KR10-2016-0042618 with English translation.
KR Office Action dated Nov. 26, 2022, in Application No. KR1020220020744 with English translation.
KR Office Action dated Oct. 24, 2022, in Application No. KR10-2014-0165420 with English Translation.
Park, Seung Hyun, et al., "Surface Analysis of Chamber Coating Materials Exposed to CF4/02 Plasma". Coatings, 2021, 11, 105, pp. 1-11.
Taiwanese First Office Action dated Apr. 21, 2021 issued in Application No. TW 106144306.
TW Office Action dated Apr. 10, 2023 in Application No. TW108137228 with English translation.
TW Office Action dated May 9, 2022, in Application No. TW107144472 with English translation.
Advisory Action dated Apr. 22, 2022 in U.S. Appl. No. 16/770,526.
Advisory Action dated Mar. 20, 2023 in U.S. Appl. No. 17/649,020.
Corrected Notice of Allowance dated Mar. 3, 2022, in U.S. Appl. No. 16/935,760.
Final Office Action dated Dec. 6, 2022 in U.S. Appl. No. 17/649,020.
Final Office Action, dated Dec. 17, 2021, issued in U.S. Appl. No. 15/794,786.
Final Office Action dated Feb. 1, 2023 in U.S. Appl. No. 16/770,526.
Non-Final Office Action dated Aug. 5, 2022, in U.S. Appl. No. 17/649,020.
Non-Final Office Action dated Jun. 26, 2023, in U.S. Appl. No. 17/649,020.
Non-Final office Action dated May 9, 2022 in U.S. Appl. No. 16/770,526.
Notice of Allowance dated Feb. 16, 2022 in U.S. Appl. No. 16/935,760.
Notice of Allowance dated May 9, 2023 in U.S. Appl. No. 16/770,526.
Notice of Allowance, dated May 8, 2019, issued in U.S. Appl. No. 15/782,410.
Office Action, dated Jan. 24, 2019, issued in U.S. Appl. No. 15/782,410.
Office Action, dated Sep. 28, 2021, issued in U.S. Appl. No. 16/935,760.
Office Action, dated Sep. 3, 2021, issued in U.S. Appl. No. 15/794,786.
Restriction Requirement dated Mar. 29, 2022, in U.S. Appl. No. 17/649,020.
Notice of Allowance dated Jan. 19, 2024 in U.S. Appl. No. 17/649,020.
CN Office Action dated Nov. 23, 2023 in CN Application No. 201880089300.8 with English translation.
CN Office Action dated Oct. 12, 2023, in application No. CN202110637340.5 with English translation.
KR Office Action dated Dec. 1, 2023 in KR Application No. 10-2020-7019522 with English Translation.
KR Office Action dated Nov. 28, 2023 in KR Application No. 10-2016-0034431 with English Translation.
KR Office Action dated Oct. 16, 2023 in KR Application No. 10-2023-0032580 with English translation.
KR Office Action dated Oct. 20, 2023, in Application No. KR10-2016-0042618 with English Translation.
KR Office Action dated Oct. 30, 2023, in Application No. KR 10-2023-0131625 with English translation.
Notice of Allowance dated Nov. 1, 2023, in U.S. Appl. No. 17/649,020.
CN Office Action dated Aug. 21, 2024 in CN Application No. 202110637340.5 with English translation.
CN Office Action dated Jun. 13, 2024 in CN Application No. 201880079241.6 with English translation.
CN Office Action dated May 24, 2024 in CN Application No. 201880089300.8 with English translation.
CN Office Action dated May 29, 2024 in CN Application No. 201980084282.9 with English translation.
Entegris Brochure., "Three Successful Precision Engineered Techniques for Coating Plasma Chamber Components," 2019, pp. 1-4.
JP Office Action dated Apr. 9, 2024 in JP Application No. 2021521275 with English Translation.
Kim Y.J., et al., "Effects of Showerhead Shapes on the Flowfields in a RF-PECVD Reactor," Surface and Coatings Technology, Apr. 1, 2005, vol. 193 (1-3), pp. 88-93.
Komiya, S., et al., "Titanium Nitride Film As a Protective Coating for a Vacuum Deposition Chamber," Thin Solid Films, Nov. 1, 1979, vol. 63(2), pp. 341-346.
KR Office Action dated Aug. 19, 2024 in KR Application No. 10-2020-7019522 with English Translation.
KR Office Action dated Feb. 22, 2024 in KR Application No. 10-2021-7014975 with English translation.
KR Office Action dated Jan. 27, 2024 in Application No. KR10-2016-0042618 with English translation.

(56) References Cited

OTHER PUBLICATIONS

KR Office Action dated Jul. 24, 2024 in KR Application No. 10-2020-7020362, with English Translation.
Final Office Action dated Apr. 9, 2024 in U.S. Appl. No. 17/930,397.
Final Office Action dated Mar. 8, 2024 in U.S. Appl. No. 17/663,614.
Non-Final Office Action dated Jun. 12, 2024 in U.S. Appl. No. 17/663,614.
Non-Final Office Action dated Jun. 21, 2024 in U.S. Appl. No. 18/447,199.
Notice of Allowance dated Aug. 1, 2024 in U.S. Appl. No. 17/930,397.
Notice of Allowance dated Feb. 7, 2024 in U.S. Appl. No. 17/649,020.
Notice of Allowance dated Sep. 18, 2024 in U.S. Appl. No. 17/663,614.
Final Office Action dated Dec. 4, 2024 in U.S. Appl. No. 18/447,199.
Hetmanczyk., et al., "Advanced Materials and Protective Coatings in Aero-engines Application," Journal of Achievements of Materials and Manufacturing Engineering, 2007, vol. 24(1), pp. 372-381.
JP Office Action dated Sep. 19, 2023 in Application No. JP2021-521275 with English Translation.
KR Office Action dated Aug. 30, 2023, in Application No. KR10-2020-7020362 with English translation.
KR Office Action dated May 1, 2023 in Application No. KR10-2022-0020744 with English translation.
Sobbia, R., et al., "Uniformity Study in Large-area Showerhead Reactors," Journal of Vacuum Science and Technology, 2005, vol. 23(4), pp. 927-932.
TW Office Action dated Jun. 28, 2023 in Application No. TW111120546 with English translation.
Non-Final Office Action dated Aug. 30, 2023, in U.S. Appl. No. 17/663,614.
Non-Final Office Action dated Sep. 12, 2023, in U.S. Appl. No. 17/930,397.
Notice of Allowance dated Aug. 16, 2023 in U.S. Appl. No. 16/770,526.
Xia, H., et al., "Experimental Study of the Effects of Showerhead Configuration on Large-area Silicon-nitride Thin Film by Plas1na-enhanced Chemical Vapor Deposition," Thin Solid Films, 2017, vol. 638, pp. 1-8.
Zhao, A., et al., "Improvement of Film Uniformity Stability of PECVD Silicon Nitride Deposition Process by Addition of Fluorine Removal to the Plasma Clean Sequence," IEEE/SEMI Conference and Workshop on Advanced Semiconductor Manufacturing, 2005, pp. 1-6.
KR Office Action dated Sep. 30, 2024 in KR Application No. 10-2023-0131625 with English Translation.
Supplemental Notice of Allowance dated Nov. 5, 2024 in U.S. Appl. No. 17/930,397.
KR Office Action dated Oct. 10, 2024 in KR Application No. 10-2021-7014975 with English Translation.
CN Office Action dated Jan. 9, 2025 in CN Application No. 201980084282.9 with English translation.
KR Office Action dated Feb. 26, 2025 in KR Application No. 10-2021-7014975, with English Translation.
Advisory Action dated Feb. 18, 2025 in U.S. Appl. No. 18/447,199.
Non-Final Office Action dated Mar. 20, 2025 in U.S. Appl. No. 18/447,199.
Supplemental Notice of Allowance dated Jan. 8, 2025 in U.S. Appl. No. 17/663,614.
CN Office Action dated May 24, 2025 in CN Application No. 201980084282.9, with English Translation.

\* cited by examiner

IN SITU PROTECTIVE COATING OF CHAMBER COMPONENTS FOR SEMICONDUCTOR PROCESSING

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

As the semiconductor and other industries advance, device dimensions are becoming increasingly smaller. These progressively smaller features require deposition procedures that are highly uniform, and the presence of film impurities or other non-uniformities can often lead to the failure of a semiconductor device.

The background provided herein is for the purposes of generally presenting the context of the disclosure. Work of the presently named inventors, to the extent that it is described in this background, as well as aspects of the description that may not otherwise qualify as prior art at the time of filing, are neither expressly nor impliedly admitted as prior art against the present disclosure.

SUMMARY

Provided herein is a method of depositing a protective coating in a reaction chamber. The method includes introducing a first reactant in a gas phase into a reaction chamber to adsorb onto surfaces of a plurality of chamber components, where the plurality of chamber components are part of the reaction chamber, and introducing a second reactant in a gas phase into the reaction chamber, where the first reactant and the second reactant react to deposit a protective coating on the surfaces of the plurality of chamber components at a temperature greater than about 200° C.

In some implementations, the first reactant reacts with the second reactant in a plasma-enhanced atomic layer deposition (PEALD) process. In some implementations, the method further includes controlling a radio-frequency (RF) signal supplied to the reaction chamber to cause a substantial portion of a plasma glow discharge of the second reactant to form in one or more areas outside an area between an upper electrode and a lower electrode. A phase difference between a first phase of the RF signal supplied to the upper electrode and a second phase of the RF signal supplied to the lower electrode may be between about 180 degrees out-of-phase and 0 degrees out-of-phase. In some implementations, the first reactant reacts with the second reactant in a thermal ALD process. In some implementations, the protective coating includes an oxide, a nitride, a carbide, or combinations thereof. The protective coating may include silicon oxide ($SiO_2$), aluminum oxide ($Al_2O_3$), zirconium oxide ($ZrO_2$), hafnium oxide ($HfO_2$), tin oxide ($SnO_2$), or silicon nitride ($Si_3N_4$). In some implementations, the method further includes depositing a film material on a wafer in the reaction chamber and on the protective coating, and etching the film material on the wafer and on the protective coating, where the film material is etched at a substantially greater rate than the protective coating. An etchant used for etching the film material may include a fluorine-based species, a chlorine-based species, a bromine-based species, an iodine-based species, or combinations thereof. In some implementations, the method further includes re-depositing the protective coating on the surfaces of the plurality of chamber components in the reaction chamber after etching the film material.

Another aspect involves a method of depositing a protective coating in a reaction chamber. The method includes depositing a protective coating on surfaces of a plurality of chamber components in a reaction chamber, where the plurality of chamber components are part of the reaction chamber, where the protective coating is deposited at a temperature greater than about 200° C. by plasma-enhanced chemical vapor deposition (PECVD), plasma-enhanced atomic layer deposition (PEALD), or thermal atomic layer deposition (thermal ALD).

In some implementations, the method further includes depositing, on the surfaces of the plurality of chamber components in the reaction chamber, a film material on the protective coating, where the film material is etched at a substantially greater rate than the protective coating during exposure to a fluorine-based species, chlorine-based species, bromine-based species, or iodine-based species. In some implementations, the method further includes re-depositing the protective coating on the surfaces of the plurality of chamber components in the reaction chamber after exposure to the fluorine-based species, chlorine-based species, bromine-based species, or iodine-based species. In some implementations, the protective coating is deposited by PECVD or PEALD, and the method further includes controlling a radio-frequency (RF) signal supplied to the reaction chamber to cause a substantial portion of a plasma glow discharge to form in one or more areas outside an area between an upper electrode and a lower electrode. A phase difference between a first phase of the RF signal supplied to the upper electrode and a second phase of the RF signal supplied to the lower electrode is about 0 degrees out-of-phase. In some implementations, the protective coating includes silicon oxide ($SiO_2$), aluminum oxide ($Al_2O_3$), zirconium oxide ($ZrO_2$), hafnium oxide ($HfO_2$), tin oxide ($SnO_2$), or silicon nitride ($Si_3N_4$), and where one or more materials of the plurality of chamber components include aluminum (Al).

Another aspect involves an apparatus including a plasma apparatus including a reaction chamber, where the reaction chamber includes a plurality of chamber components. The plasma apparatus further includes a controller configured with instructions for performing the following operations: introducing a first reactant in a gas phase into the reaction chamber to adsorb onto surfaces of the plurality of chamber components, where the plurality of chamber components are part of the reaction chamber, and introducing a second reactant in a gas phase into the reaction chamber, where the first reactant and the second reactant react to deposit a protective coating on the surfaces of the plurality of chamber components at a temperature greater than about 200° C.

In some implementations, the first reactant reacts with the second reactant in a plasma-enhanced atomic layer deposition (PEALD) process. In some implementations, the plasma apparatus further includes an RF power supply coupled to the controller, where the controller is further configured with instructions for performing the following operation: controlling a radio-frequency (RF) signal supplied to the reaction chamber to cause a substantial portion of a plasma glow discharge of the second reactant to form in one or more areas outside an area between an upper electrode and a lower electrode. In some implementations, a phase difference between a first phase of the RF signal supplied to the upper electrode and a second phase of the RF signal supplied to the lower electrode is between about 180 degrees out-of-phase and 0 degrees out-of-phase. In some implementations, the phase difference is about 0 degrees out-of-phase. In some implementations, the first reactant reacts with the second reactant in a thermal ALD process. In some implementations, the protective coating includes an oxide, a nitride, a carbide, or combinations thereof. In some implementations, the plurality of chamber components include at least chamber walls of the reaction chamber. In some implementations, the controller is further configured with instructions for performing the following operations: depositing a film material on a wafer in the reaction chamber and on the protective coating, and etching the film material on the wafer and on the protective coating, wherein the film material is etched at a substantially greater rate than the protective coating.

Another aspect involves an apparatus including a plasma apparatus including a reaction chamber, where the reaction chamber includes a plurality of chamber components. The plasma apparatus further includes a controller configured with instructions for performing the following operations: depositing a protective coating on surfaces of a plurality of chamber components in a reaction chamber, where the plurality of chamber components are part of the reaction chamber, wherein the protective coating is deposited at a temperature greater than about 200° C. by plasma-enhanced chemical vapor deposition (PECVD), plasma-enhanced atomic layer deposition (PEALD), or thermal atomic layer deposition (thermal ALD).

In some implementations, the controller is further configured with instructions for performing the following operation: depositing, on the surfaces of the plurality of chamber components in the reaction chamber, a film material on the protective coating, wherein the film material is etched at a substantially greater rate than the protective coating during exposure to a fluorine-based species, chlorine-based species, bromine-based species, or iodine-based species. In some implementations, the controller is further configured with instructions for performing the following operation: re-depositing the protective coating on the surfaces of the plurality of chamber components in the reaction chamber after exposure to the fluorine-based species, chlorine-based species, bromine-based species, or iodine-based species. In some implementations, the protective coating is deposited by PECVD or PEALD, and the controller is further configured with instructions for performing the following operation: controlling a radio-frequency (RF) signal supplied to the reaction chamber to cause a substantial portion of a plasma glow discharge to form in one or more areas outside an area between an upper electrode and a lower electrode.

These and other aspects are described further below with reference to the drawings.

DETAILED DESCRIPTION

Figure 1:
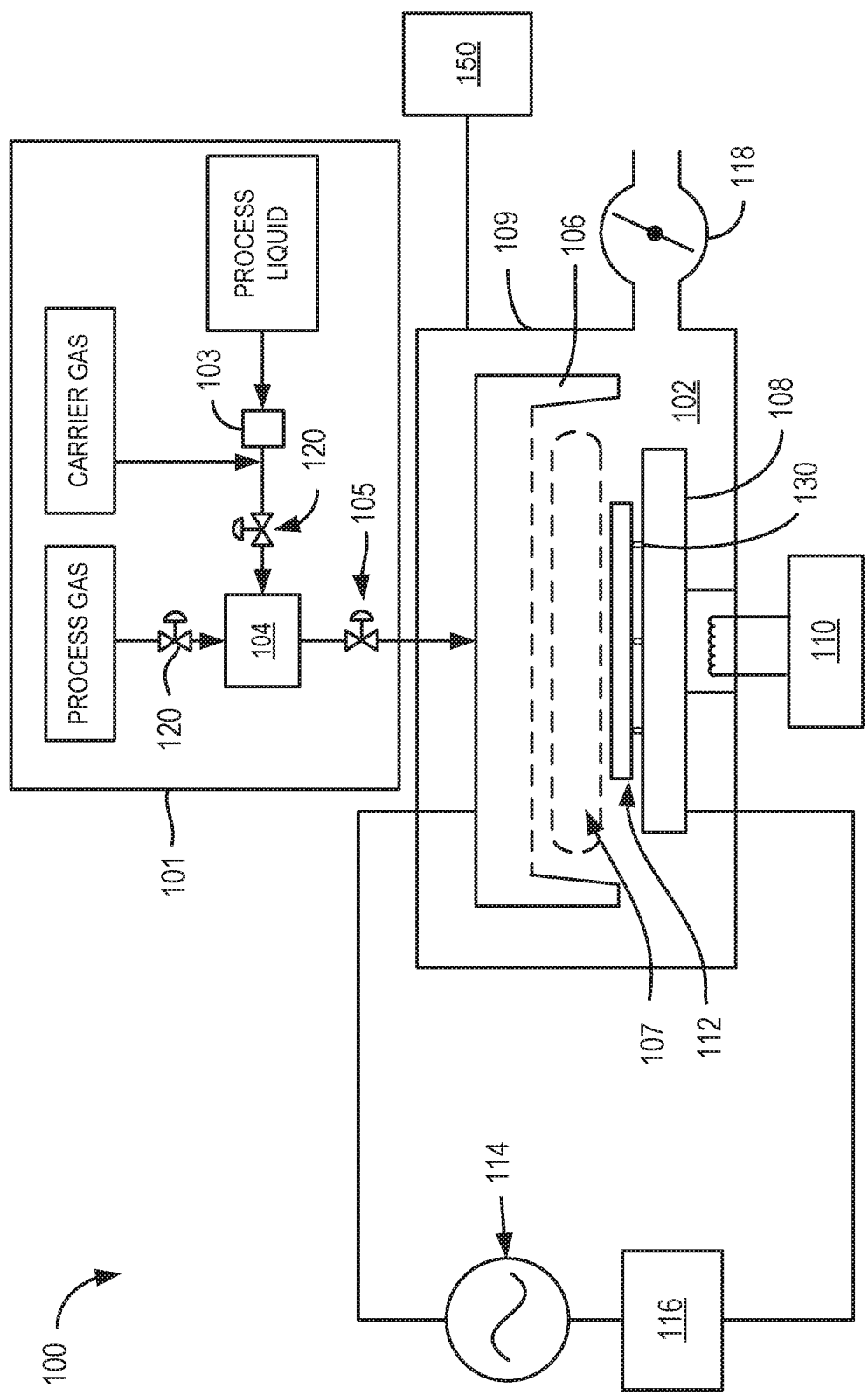
FIG. 1 illustrates a cross-sectional schematic of an example apparatus for performing in situ coating of chamber components in a reaction chamber according to some implementations.

In the present disclosure, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication. A wafer or substrate used in the semiconductor device industry typically has a diameter of 200 mm, or 300 mm, or 450 mm. The following detailed description assumes the present disclosure is implemented on a wafer. However, the present disclosure is not so limited. The work piece may be of various shapes, sizes, and materials. In addition to semiconductor wafers, other work pieces that may take advantage of the present disclosure include various articles such as printed circuit boards and the like.

Introduction

When fabricating semiconductor devices, it is advantageous for the fabrication process to be precise and repeatable. Unfortunately, as a semiconductor fabrication apparatus processes additional wafers over time, the processing conditions and chemistries within the apparatus change. The processing conditions and chemistries may result in contamination and defect issues in wafers and degradation of a reaction chamber of the semiconductor fabrication apparatus.

Semiconductor devices are increasingly sensitive to contamination and defect issues. Particles and film impurities may originate from internal surfaces of the reaction chamber. For example, the particles and film impurities may originate from internal chamber walls, ceiling, showerhead, substrate support, lift pins, gas lines, nozzles, etc. In a particular example, the reaction chamber and/or chamber components may be made of aluminum, such as aluminum 6061-T6 (which may include aluminum and small amounts of other materials such as chromium, copper, iron, magnesium, manganese, silicon, titanium, zinc, etc.). In many cases, the particles and film impurities are generated as the reaction chamber is exposed to plasma or other harsh processing conditions, and these particles and film impurities may fall onto a wafer surface during processing. For example, chamber components exposed to an in situ plasma during deposition may flake and peel, thereby causing undesirable impurities to fall onto a wafer being processed. This causes contamination of the wafer and increases the likelihood of device failure.

The processing conditions and chemistries not only have an effect on the wafers processed within the apparatus but also on internal surfaces of a reaction chamber of the semiconductor fabrication apparatus. As the reaction chamber is used to deposit film on a series of wafers over time, various film byproducts build up on the internal surfaces of the reaction chamber. The reaction chamber may undergo etch processes to remove the deposited film. In some cases, the etch process may involve exposing the wafer and the reaction chamber to halogen-based species, where the halogen-based species may include fluorine (F), chlorine (Cl), bromine (Br), or iodine (I). The reaction chamber may undergo cleaning processes to remove the film byproducts from the internal surfaces of the reaction chamber. In some cases, the cleaning process involves exposing the reaction chamber to one or more of the aforementioned halogen-based species. The reaction chamber may undergo deposition processes to deposit film on a wafer. In some cases, the deposition process involves exposing the reaction chamber to one or more of the aforementioned halogen-based species. The reaction chamber, including its chamber components and chamber walls, are often made of metallic material such as aluminum. Chamber components and chamber walls made of metallic material may be attacked by halogen-based species and can readily form volatile salts. For example, an aluminum chamber component can be attacked by fluorine radicals and form aluminum fluoride ($AlF_3$), which is volatile under appropriate conditions. These kinds of reactions significantly increase a surface area of the chamber components, which changes the surface properties of the chamber components, and thereby changes the deposition or other processing results for wafers processed in the reaction chamber over time. Furthermore, these kinds of reactions can lead to erosion of the chamber components and chamber walls and degradation of the reaction chamber over time.

One technique to combat against particle generation is to coat surfaces of the reaction chamber with an undercoat. An undercoat may also be referred to as a conditioning layer or protective layer. An undercoat is generally a layer of material that is formed in situ on internal surfaces of a reaction chamber. The undercoat may serve to minimize metallic contamination from exposed internal surfaces. Typically, an undercoat is deposited while there is no wafer present in the reaction chamber. Undercoats are further described in U.S. patent application Ser. No. 14/089,653, filed Nov. 25, 2013, and titled "CHAMBER UNDERCOAT PREPARATION METHOD FOR LOW TEMPERATURE ALD FILMS," which is incorporated by reference in its entirety and for all purposes.

While undercoats are useful in reducing particle generation and the related contamination, undercoats also present certain challenges. First, undercoats often provide incomplete coverage on some of the internal surfaces of the reaction chamber. Certain parts of the reaction chamber may not be exposed to reactants necessary for film formation. Second, undercoats are generally formed as a result of exposure to thermal energy, but are not heated to appropriate temperatures to withstand harsh processing conditions. Such undercoats will not last long and are vulnerable to degradation under thermal stresses and plasma stresses. Third, some undercoats result in microporous structures deposited on the internal surfaces of the reaction chamber. A microporous structure may result in substantial losses when exposed to plasma. Such undercoats that are microporous, that provide incomplete coverage, or that are unsuitable to withstand harsh processing conditions will cause the reaction chamber to be subject to degradation. The reaction chamber may degrade over time when subjected to elevated temperatures and/or plasma or halogen-based chemistries.

Another technique to combat against particle generation or chamber degradation is to provide a protective coating by ex situ deposition. A protective coating is considered to be deposited ex situ where the protective coating is deposited on a chamber component in a first reaction chamber, and then the chamber component is removed and installed in a second reaction chamber. In these instances, the chamber component serves as a substrate being coated when it is in the first reaction chamber, and serves its intended function when installed in the second reaction chamber. Ex situ coatings are further described in U.S. patent application Ser. No. 15/954,454, filed Apr. 16, 2018, and titled "EX SITU COATING OF CHAMBER COMPONENTS FOR SEMICONDUCTOR PROCESSING," which is incorporated by reference in its entirety and for all purposes.

While ex situ coatings are useful in limiting particle contamination, providing more complete coverage of surfaces of chamber components, and protecting against chamber degradation, ex situ coatings also present certain challenges. First, ex situ coatings are deposited in separate reaction chambers, which increases throughput. Not only do the coated chamber components require transfer and installation steps into another reaction chamber, but the chamber components will undergo more removal, transfer, and re-installation steps to be periodically re-coated. Second, ex situ coatings are typically deposited using a conventional deposition technique such as plasma spray, thermal spray, or physical vapor deposition (PVD). These deposition techniques are performed at low temperatures, such as temperatures below about 200° C. This limits the quality of the protective coating when the protective coating is exposed to harsh processing conditions. Therefore, such protective coatings are prone to crack and degrade when subject to plasma or elevated temperatures. Once the protective coatings fail, wafers are vulnerable to particle contamination and drift in processing results, and the reaction chamber is subject to degradation and erosion.

Apparatus

The methods described herein may be performed by any suitable apparatus. The suitable apparatus includes hardware for accomplishing the process operations and a system controller having instructions for controlling process operations in accordance with the present embodiments. For example, in some embodiments, the hardware may include one or more process stations included in a process tool.

Deposition techniques for providing an in situ protective coating on chamber components as described herein may be implemented in any plasma-enhanced chemical vapor deposition (PECVD) apparatus or atomic layer deposition (ALD) apparatus. The apparatus may take many forms, and may be part of a process tool that includes one or more chambers or reactors (sometimes referred to as process stations). For certain operations, example apparatuses such as from the VECTOR™ product family or the Striker™ product family, each available from Lam Research Corporation of Fremont, California, may be suitable apparatuses.

FIG. 1 illustrates a cross-sectional schematic of an example apparatus for performing in situ coating of chamber components in a reaction chamber according to some implementations. An apparatus 100 may include a reaction chamber 102 and may deposit a protective coating on a plurality of chamber components in the reaction chamber 102 as described herein. It will be understood that the apparatus 100 may also be used to deposit film, etch film, and/or clean film byproducts in the reaction chamber 102 for semiconductor processing. In some embodiments, the apparatus 100 may deposit film on wafers using ALD or PECVD techniques, and the apparatus 100 may deposit the protective coating on chamber components in the reaction chamber 102 using ALD or PECVD techniques. For simplicity, the apparatus 100 is depicted as a standalone reactor having a reaction chamber 102 for maintaining a low-pressure environment. However, it will be appreciated that a plurality of apparatuses 100 may be included in a common process tool environment. Further, it will be appreciated that, in some embodiments, one or more hardware parameters of the apparatus 100, including those discussed in detail below, may be adjusted programmatically by one or more system controllers.

The reaction chamber 102 fluidly communicates with a reactant delivery system 101 for delivering process gases to a distribution showerhead 106. Reactant delivery system 101 includes a mixing vessel 104 for blending and/or conditioning process gases for delivery to the showerhead 106. One or more mixing vessel inlet valves 120 may control introduction of process gases to mixing vessel 104. Similarly, a showerhead inlet valve 105 may control introduction of process gases to the showerhead 106.

Some reactants may be stored in liquid form prior to vaporization at and subsequent delivery to the reaction chamber 102. For example, the embodiment in FIG. 1 includes a vaporization point 103 for vaporizing liquid reactant to be supplied to the mixing vessel 104. The vaporization point 103 may be omitted in cases where the reactants are all gas. In some embodiments, the vaporization point 103 may be a heated vaporizer. The reactant vapor produced from such vaporizers may condense in downstream delivery piping. Exposure of incompatible gases to the condensed reactant may create small particles. These small particles may clog piping, impede valve operation, contaminate wafers, etc. Some approaches to addressing these issues involve sweeping and/or evacuating the delivery piping to remove residual reactant. However, sweeping the delivery piping may increase reaction chamber cycle time, degrading reaction chamber throughput. Thus, in some embodiments, delivery piping downstream of vaporization point 103 may be heat traced. In some examples, mixing vessel 104 may also be heat traced. In one non-limiting example, piping downstream of vaporization point 103 has an increasing temperature profile extending from approximately 100° C. to approximately 150° C. at mixing vessel 104.

In some embodiments, reactant liquid may be vaporized at a liquid injector. For example, a liquid injector may inject pulses of liquid reactant into a carrier gas stream upstream of the mixing vessel 104. In one embodiment, a liquid injector may vaporize reactant by flashing the liquid from a higher pressure to a lower pressure. In another embodiment, a liquid injector may atomize the liquid into dispersed micro-droplets that are subsequently vaporized in a heated delivery pipe. It will be appreciated that the smaller droplets may vaporize faster than larger droplets, reducing a delay between liquid injection and complete vaporization. Faster vaporization may reduce a length of piping downstream from vaporization point 103. In one scenario, a liquid injector may be mounted directly to mixing vessel 104. In another scenario, a liquid injector may be mounted directly to showerhead 106.

In some embodiments, a liquid flow controller (LFC) upstream of the vaporization point 103 may be provided for controlling a mass flow of liquid for vaporization and delivery to the reaction chamber 102. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

The reaction chamber 102 includes chamber walls 109 to enclose the reaction chamber 102 from an outside environment. The chamber walls 109 include chamber sidewalls, ceilings, floors, etc. The reaction chamber 102 further includes the showerhead 106 for distributing process gases. It will be appreciated that the showerhead 106 may have any suitable shape, and may have any suitable number and arrangement of ports for distributing process gases into the reaction chamber 102. The reaction chamber 102 further includes a chuck or pedestal 108 for supporting a wafer 112. In the embodiment shown in FIG. 1, the pedestal 108 and the wafer 112 are located beneath the showerhead 106, and the wafer 112 is shown resting on lift pins 130 on the pedestal 108. It will be understood that depositing the protective coating on chamber components of the reaction chamber 102 as described herein may occur while no wafer 112 is present in the reaction chamber 102. However, it will also be appreciated that depositing the protective coating on chamber components of the reaction chamber 102 as described herein may occur while the wafer 112 is present in the reaction chamber 102. Chamber components on which the protective coating may be deposited include but are not limited to the chamber walls 109 (including sidewalls, ceilings, floors, etc.), the pedestal 108, the showerhead 106, and the lift pins 130.

In some embodiments, a volume 107 is located between the showerhead 106 and the pedestal 108. In some embodiments, a position of the showerhead 106 or a position of the pedestal 108 may be adjusted to vary a size of the volume 107 between the showerhead 106 and the pedestal 108. It will be appreciated that the vertical position of the showerhead 106 and/or the pedestal 108 may be varied by any suitable mechanism. Example sizes of the volume 107 include but are not limited to volumes between about 0.1 liters and about 2 liters. Larger sizes may be needed to accommodate relatively larger chamber components. In some embodiments, a plasma glow discharge may be generated between the showerhead 106 and the pedestal 108 in the volume 107 to deposit the protective coating on chamber components. In some embodiments, a plasma glow discharge may be generated in a region outside the volume 107 and adjacent to chamber walls 109 to deposit the protective coating on chamber components.

As shown in FIG. 1, a showerhead 106 and a pedestal 108 may electrically communicate with RF power supply 114 and matching network 116 for powering a plasma. In some embodiments, the plasma energy may be controlled by controlling one or more of a process station pressure, a gas concentration, an RF power source, an RF source frequency, a phase difference of an RF signal, and a plasma power pulse timing. For example, RF power supply 114 and matching network 116 may be operated at any suitable power to form a plasma having a desired composition of radical species. Likewise, RF power supply 114 may provide RF power of any suitable frequency. In some embodiments, RF power supply 114 may be configured to control high- and low-frequency RF power sources independently of one another. Example low-frequency RF frequencies may include, but are not limited to, frequencies between 50 kHz and 700 kHz. Example high-frequency RF frequencies may include, but are not limited to, frequencies between 1.8 MHz and 2.45 GHz. Moreover, RF power supply 114 may control a phase difference of an RF signal supplied to both a lower and upper electrode. For example, a phase difference can be anywhere between about 180 degrees out-of-phase and 0 degrees out-of-phase. It will also be appreciated that any suitable parameters may be modulated discretely or continuously to provide plasma energy for the surface reactions. In one non-limiting example, the plasma power may be intermittently pulsed.

In some embodiments, the plasma may be monitored in situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In yet another scenario, plasma position may be monitored and measured by one or more phase sensors. In some embodiments, one or more plasma parameters may be programmatically adjusted based on measurements from such in situ plasma monitors. Other plasma monitors may include but are not limited to infrared (IR) monitors, acoustic monitors, and pressure transducers.

In some embodiments, the plasma may be controlled via input/output control (IOC) sequencing instructions. In one example, the instructions for setting plasma conditions for a plasma process phase may be included in a corresponding plasma activation recipe phase of a deposition process recipe. In some cases, process recipe phases may be sequentially arranged, so that all instructions for a deposition process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some embodiments, RF power supply 114 and matching network 116 may be omitted in cases where the protective coating is formed through a thermally driven reaction rather than a plasma driven reaction. For example, the protective coating may be formed by thermal ALD. Nonetheless, the RF power supply 114 and matching network 116 may be useful for non-deposition related processes such as cleaning operations and treatment operations.

In some embodiments, the pedestal 108 may be temperature controlled via heater 110. Further, in some embodiments, pressure control for the reaction chamber 102 may be provided by an exhaust valve 118. As shown in FIG. 1, the exhaust valve 118 throttles a vacuum provided by a downstream vacuum pump system (not shown). The vacuum pump system may include a roughing pump and/or turbomolecular pump. However, in some embodiments, pressure control of the reaction chamber 102 may also be adjusted by varying a flow rate of one or more gases introduced into the reaction chamber 102.

In some implementations, a controller 150 is part of a system, which may be part of the apparatus 100. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or type of system, may be programmed to control any of the processes disclosed herein, including the delivery of process gases, temperature settings, pressure settings, vacuum settings, power settings, RF generator settings, RF matching circuit settings, phase difference settings, frequency settings, flow rate settings, fluid delivery settings, positional and operation settings, wafer transfers into and out of a tool and other transfer tools and/or load locks connected to or interfaced with a specific system.

The controller 150 may be in operative communication with the apparatus 100. In some implementations, the controller 150 includes a processor system (e.g., microprocessor) configured to execute instructions held in a data system (e.g., memory). In some implementations, the controller 150 may be in communication with a plasma generator controller to control plasma parameters and/or conditions. In some implementations, the controller 150 may be in communication with the pedestal 108 to control pedestal elevation and temperature. The controller 150 may contain instructions for controlling process conditions for operation of the apparatus 100. The controller 150 will typically include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller 150 or they may be provided over a network.

In some implementations, the controller 150 may control all or most activities of the apparatus 100. For example, the controller 150 may execute system control software including sets of instructions for controlling plasma generation, plasma position, and parameters such as gas flow composition and temperature in depositing a protective coating in the reaction chamber 102. In some implementations, the controller 150 may execute control software including sets of instructions for controlling chamber pressure, gas flow rates, phase difference of an RF signal, and other parameters involving coating chamber components with a protective coating. Other computer programs, scripts, or routines stored on memory devices associated with the controller 150 may be employed in some embodiments.

In some implementations, the controller 150 may be configured with instructions for performing the following operation: depositing a protective coating on surfaces of a plurality of chamber components in a reaction chamber 102, where the plurality of chamber components are part of the reaction chamber 102, where the protective coating is deposited at a temperature greater than about 200° C. by plasma-enhanced chemical vapor deposition (PECVD), plasma-enhanced atomic layer deposition (PEALD), or thermal atomic layer deposition (thermal ALD). In some implementations, the controller 150 may be further configured with instructions for performing the following operation: depositing, on the surfaces of the plurality of chamber components in the reaction chamber 102, a film material on the protective coating, where the film material is etched at a substantially greater rate than the protective coating during exposure to a fluorine-based etch, chlorine-based etch, bromine-based etch, or iodine-based etch. In some implementations, the controller 150 may be further configured with instructions for performing the following operation: controlling an RF signal supplied to the reaction chamber to cause a substantial portion of a plasma glow discharge to form in one or more areas outside an area adjacent to a pedestal 108.

Broadly speaking, the controller 150 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, surfaces, circuits, and/or dies of a wafer.

The controller 150, in some implementations, may be a part of or coupled to a computer that is integrated with, coupled to the system, otherwise networked to the system, or a combination thereof. For example, the controller 150 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 150 receives instructions in the form of data, which specify parameters for each of the processing steps to be performed during one or more operations. It should be understood that the parameters may be specific to the type of process to be performed and the type of tool that the controller 150 is configured to interface with or control. Thus as described above, the controller 150 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

As noted above, depending on the process step or steps to be performed by the tool, the controller 150 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

In Situ Protective Coating

The present disclosure relates to in situ deposition of protective coatings of chamber components in a reaction chamber. The in situ protective coatings may be deposited on chamber walls and other exposed, internal surfaces of chamber components in the reaction chamber. In situ protective coatings are deposited under a high temperature environment and/or plasma environment so that the in situ protective coatings may be able to withstand subsequent plasma processes, high temperature processes, and other harsh processing conditions. For example, the in situ protective coatings may be deposited in the reaction chamber at a temperature greater than about 200° C., or between about 250° C. and about 650° C. The materials of the in situ protective coating may be highly resistant to one or more halogen-based chemistries. Subsequent layers deposited on the in situ protective coating may have a different etch selectivity than the in situ protective coating. In some embodiments, the in situ protective coating is deposited prior to use of wafer processing in the reaction chamber. In some embodiments, the in situ protective coating is deposited or re-deposited after one or more wafers are processed by the reaction chamber. The reaction chamber may be part of a processing apparatus such as the apparatus 100 in FIG. 1.

As used herein, a protective coating is considered to be deposited "in situ" where the protective coating is deposited on the chamber component in a reaction chamber that the chamber component is a part of. In other words, deposition of the protective coating takes place on the chamber component where the chamber component serves its intended purpose (e.g., as a showerhead, lift pin, etc.) when installed in the reaction chamber. Thus, the chamber component is coated in the same reaction chamber in which the chamber component participates in a fabrication process. The chamber component does not need to be coated in a separate chamber that it is a part of. As used herein, the in situ protective coating of the present disclosure may also be referred to as a protective coating, surface coating, in situ coating, undercoat, conditioning layer, protective layer, surface layer, in situ layer, and the like.

As described above, the protective coating of the present disclosure may be deposited using PECVD techniques or ALD techniques. In some implementations, the protective coating may be deposited by thermal ALD or plasma-enhanced ALD (PEALD). Vapor deposition processes may supply reactive gases to a wafer surface to induce reactions in a plasma environment or thermal environment and produce a film of material. PECVD uses a plasma to enhance a film deposition mechanism and can provide fast growth of materials and high throughput. ALD uses two or more process gases that are introduced alternatingly and sequentially. ALD uses surface-self-limiting reactions to deposit films on a layer-by-layer basis. PECVD uses activated gas phase reactions to deposit films, and ALD uses surface-mediated deposition reactions to deposit films on a layer-by-layer basis. A typical ALD cycle may include: (i) dosing that delivers and adsorbs precursor material onto a substrate surface, (ii) purging excess precursor material from the chamber and leaving a self-limited monolayer on the substrate surface, (iii) delivery of reactant material to react with the adsorbed precursor material, and (iv) purging of unreacted reactant material or reaction byproducts from the chamber. Deposition reactions in the ALD cycle may be thermally-induced or plasma-induced. ALD may be used to produce a highly conformal film.

Protective coatings or undercoats may be deposited on surfaces of chamber components in a reaction chamber. The protective coatings may be deposited in situ and reduce particle contamination and defect issues in wafer processing. The protective coatings may be formed under high temperature and/or plasma conditions within the reaction chamber to provide high-quality coatings.

Figure 2A:
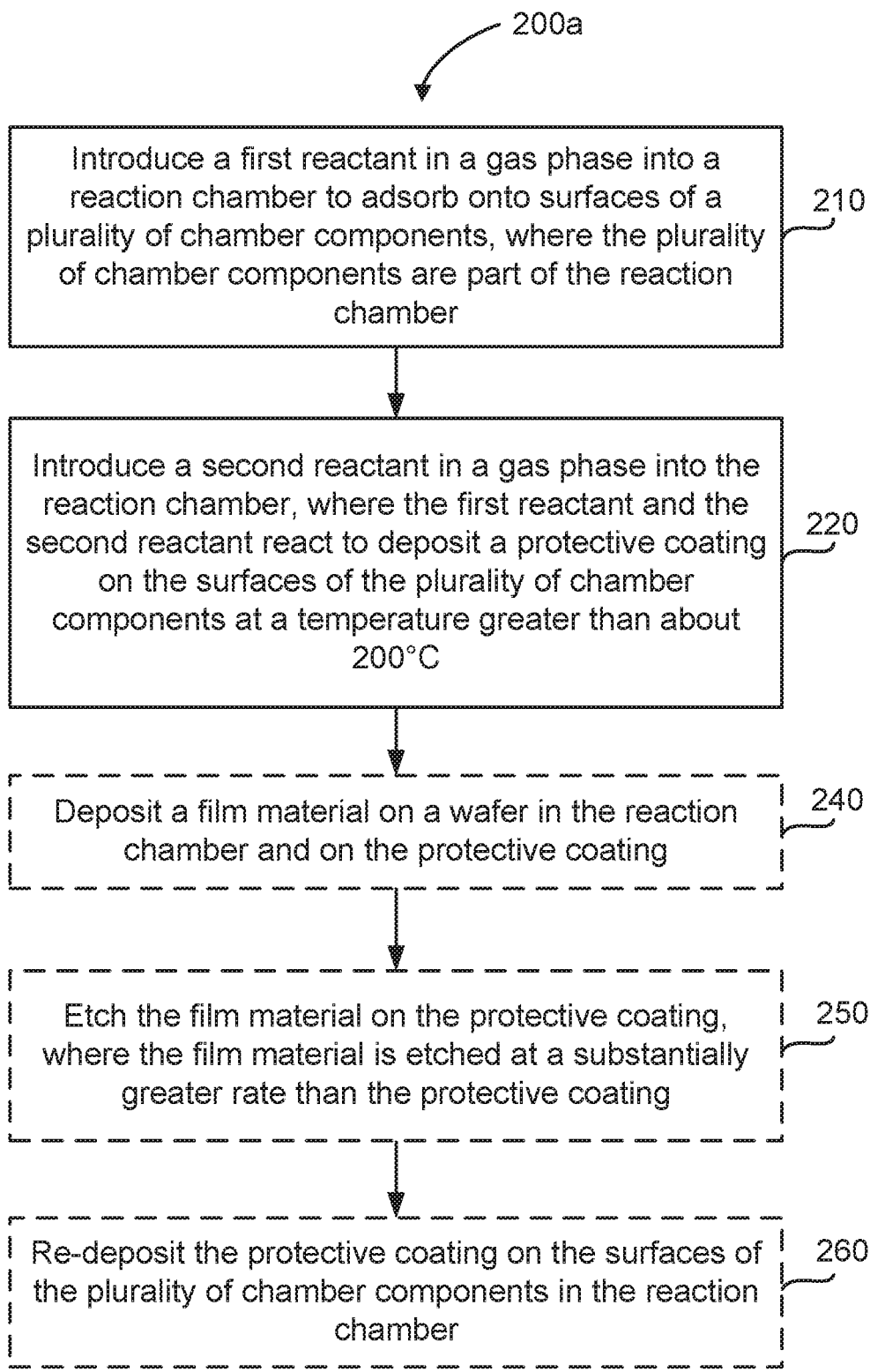
FIG. 2A shows a flow diagram of an example atomic layer deposition (ALD) method of coating a plurality of chamber components in a reaction chamber according to some implementations.

FIG. 2A shows a flow diagram of an example ALD method of coating a plurality of chamber components in a reaction chamber according to some implementations. Operations of a process 200a in FIG. 2A may include additional, fewer, or different operations. The ALD method may include thermal ALD or PEALD.

At block 210 of the process 200a, a first reactant is introduced in a gas phase into a reaction chamber to adsorb onto surfaces of a plurality of chamber components, where the plurality of chamber components are part of the reaction chamber. The first reactant adsorbs onto exposed surfaces of the chamber components in a self-limiting manner. The first reactant is provided in the reaction chamber during a dose phase of an ALD cycle, where an example dose time for the first reactant may be between about 1 second and about 30 seconds. In some implementations, a purge phase may follow the dose phase at block 210, where the purge phase can purge any excess first reactant from the reaction chamber. In some implementations, the first reactant can include a metal-containing precursor and/or silicon-containing precursor.

At block 220 of the process 200a, a second reactant is introduced in a gas phase into the reaction chamber, where the first reactant and the second reactant react to deposit a layer of a protective coating on the surfaces of the plurality of chamber components at a temperature greater than about 200° C. In some cases, the reaction is thermally driven. In some cases, the reaction is plasma driven. In some implementations, the deposition reaction takes place in a high temperature environment. The high temperature environment involves an elevated temperature greater than about 200° C., between about 225° C. and about 700° C., between about 250° C. and about 650° C., or between about 300° C. and about 600° C. It will be appreciated that in depositing some protective coatings, a high temperature environment is not necessary to deposit a high-quality film. The high temperature environment may be sustained during the reaction by ensuring that the reaction chamber reaches and maintains the elevated temperature, or at least by ensuring that chamber components such as a substrate support (e.g., pedestal) reaches and maintains the elevated temperature.

The second reactant adsorbs onto exposed surfaces of the chamber components and produces an adsorption-limited amount of the protective coating. The second reactant is provided in the reaction chamber during a reaction phase of the ALD cycle. The reaction phase of the ALD cycle may exposure the surfaces of the plurality of chamber components to plasma and/or high temperatures, where such exposure may last for a duration between about 0.5 seconds and about 20 minutes. In some implementations, a purge phase may follow the reaction at block 220, where the purge phase can purge any excess second reactant and byproducts from the reaction chamber. In some implementations, the second reactant may include an oxygen-containing gas (e.g., $O_2$), a nitrogen-containing gas (e.g., $N_2$ or $NH_3$), or a carbon-containing gas. Plasma-activated species of the second reactant may include radicals and/or ions of the second reactant.

The protective coating may be deposited on surfaces of the plurality of chamber components without a wafer present in the reaction chamber. Thus, the ALD cycles for depositing the protective coating occur without a wafer in the reaction chamber. However, in some instances, it will be appreciated that the protective coating may be deposited on surfaces of the plurality of chamber components with a wafer present in the reaction chamber. In some implementations, blocks 210 and 220 are repeated so that multiple ALD cycles are performed to produce a desired thickness of the protective coating. In some implementations, a thickness of the protective coating is between about 0.1 µm and about 4 µm, or between about 0.5 µm and about 3 µm, or between about 0.5 µm and about 2 µm.

The protective coating may be resistant to at least some halogen-based chemistries, where halogen-based chemistries may include fluorine-based species (e.g., $F_2$, $NF_3$, $ClF_3$), chlorine-based species (e.g., $Cl_2$, $ClF_3$, $BCl_3$), bromine-based species (e.g., HBr), iodine-based species (e.g., $I_2$), or combinations thereof. Exposure to halogen-based chemistries may occur during deposition processes, etch processes, and/or cleaning processes. Halogen-based chemistries may include halogen-containing etchants, halogen-containing precursors, and halogen-containing byproducts. The protective coating may be deposited on surfaces of the plurality of chamber components to protect the chamber components against attack. In some implementations, the resistance of the protective coating to a particular halogen-based chemistry may be measured or determined by its etch rate. In some implementations, the etch rate of the protective coating is less than about 10 Å per minute, less than about 5 Å per minute, less than about 3 Å per minute, less than about 1 Å per minute, or between about 0.01 Å per minute and about 1 Å per minute when exposed to one or more halogen-based chemistries. The etch rate may vary depending on the type of halogen-based chemistry. For example, the protective coating may be resistant against fluorine-based species but not chlorine-based species. In some implementations, removal of the protective coating may occur using alternate chemistries that are not damaging to underlying materials (e.g., aluminum) of the chamber components.

In some implementations, the protective coating includes an oxide, a nitride, a carbide, or combinations thereof. For example, the protective coating may include silicon oxide ($SiO_2$), aluminum oxide ($Al_2O_3$), zirconium oxide ($ZrO_2$), hafnium oxide ($HfO_2$), tin oxide ($SnO_2$), or silicon nitride ($Si_3N_4$). It will be appreciated that the protective coating is not limited to binary metal oxides, nitrides, or carbides, but may include other classes of materials that exhibit resistance to halogen-based chemistries. The etch rate of the protective coating depends on its composition and what chemistry the protective coating is exposed to. For example, $Al_2O_3$ may be strongly resistant to chlorine-based species, $ZrO_2$ may be strongly resistant to fluorine-based species and bromine-based species, $HfO_2$ may be strongly resistant to chlorine-based species, $SnO_2$ may not be resistant to chlorine-based species, and $SiO_2$ may not be resistant to fluorine-based species. Thus, a deposited layer of $SnO_2$ may be removed at a high etch rate when exposed to a chlorine-based species, but a protective coating of $Al_2O_3$ may be removed at a very low etch rate when exposed to the same chlorine-based species. Table 1 provides a list of protective coatings and their respective etch rates in relative terms when exposed to certain halogen-based chemistries.

TABLE 1

| | $SiO_2$ | $Al_2O_3$ | $SnO_2$ | $ZrO_2$ | $HfO_2$ |
|---|---|---|---|---|---|
| $Cl_2$ | Low | Low | High | Low | Med |
| $NF_3$ | High | Low | Low | Low | Low |
| $BCl_3$ | Low | Med | High | Low | Med |
| HBr | Low | Low | High | Low | Unknown |

Protective coatings having a low etch rate against particular halogen-based chemistries are good candidates as protective coatings when a film being etched has a high etch rate when etched by the particular halogen-based chemistry.

Depositing the protective coating under certain processing conditions improves the quality of the coating. In some implementations, the quality of the coating may be correlated with at least its density. Thus, the protective coating deposited in situ and based on processing conditions described herein (e.g., high temperatures) may have a greater density than a coating deposited ex situ and/or based on different processing conditions (e.g., low temperatures). This can be the case even if the coatings share identical composition. With an improved density, the protective coating may be substantially free of pinholes. In some implementations, the processing conditions for depositing high quality coatings include a high temperature range (e.g., greater than about 200° C.). In some implementations, the processing conditions for depositing high quality coatings include a low chamber pressure (e.g., less than about 10 Torr). In some implementations, the high quality coating lasts longer and is able to sustain thermal stress and plasma stress compared to coatings deposited ex situ and/or under different processing conditions.

Depositing the protective coating by ALD typically provides high conformality. In some implementations, conformality may be calculated by comparing the average thickness of a deposited film on a bottom, sidewall, or top of a feature to the average thickness of the deposited film on the bottom, sidewall, or top of the feature. For example, conformality may be calculated by dividing the average thickness of the deposited film on the sidewall by the average thickness of the deposited film at the top of the feature and multiplying it by 100 to obtain a percentage. In some implementations, the conformality of the protective coating is between about 50% and about 100%, between about 80% and about 100%, or between about 85% and about 100%.

In some implementations, the surfaces of the plurality of chamber components include exposed, internal surfaces of the plurality of chamber components in the reaction chamber. Conditions of the ALD process performed at blocks 210 and 220 can be tuned to facilitate conformal deposition of high-quality in situ protective coatings to occur on the exposed, internal surfaces of the plurality of chamber components. In some implementations, the plurality of chamber components include chamber walls, which may comprise sidewalls, floors, and ceilings of the reaction chamber. In some implementations, a plasma glow discharge may be generated in areas adjacent to the chamber walls of the reaction chamber to direct plasma towards the chamber walls. In some instances, the plasma glow discharge may be generated in areas outside of a region between a showerhead and a pedestal of the reaction chamber. Directing the plasma towards the chamber walls may facilitate more uniform, more complete, and more conformal deposition of the protective coating on exposed, internal surfaces of the plurality of chamber components.

In some embodiments, the plasma may be directed towards the chamber walls by controlling the phase between RF signals provided to each of a showerhead and a pedestal in the reaction chamber, or more generally between RF signals provided to each of an upper electrode and a lower electrode in the reaction chamber. Control of a phase difference between RF signals supplied to the upper electrode and the lower electrode assists in controlling the position of a plasma glow discharge generated in the reaction chamber. A phase difference between a first phase of the RF signal supplied to the upper electrode and a second phase of the RF signal supplied to the lower electrode may be between about 180 degrees out-of-phase and 0 degrees out-of-phase. For example, the phase difference between the upper electrode and the lower electrode may be substantially 0 degrees out-of-phase so that the plasma glow discharge is concentrated proximate the chamber walls.

In some implementations of the process 200a, a film material is deposited on the surfaces of the plurality of chamber components in the reaction chamber, where the film material is etched at a substantially greater rate than the protective coating during exposure to a fluorine-based etch, chlorine-based etch, bromine-based etch, or iodine-based etch. The film material may be removed from the reaction chamber without removing the protective coating. In some implementations, the film material is deposited on a wafer in the reaction chamber and everywhere else in the reaction. In some implementations, the film material is deposited as an additional protective layer on the protective coating. Depending on the deposition/etch/cleaning chemistries that the reaction chamber is expected to provide, multiple protective coatings may be selected to be deposited on the surfaces of the chamber components. A first protective coating may be resistant to a first etchant and a second protective coating may be resistant to a second etchant. For example, the second protective coating may include $Al_2O_3$ to resist a chlorine-based etchant and the first protective coating may include $ZrO_2$ to resist a fluorine-based etchant. It will be appreciated that additional protective coatings may be deposited on the surfaces of the plurality of chamber components depending on the etch/clean operations that are expected to be performed in the reaction chamber. Each of the protective coatings may be selected for its resistance to a particular etch/clean chemistry.

At block 240 of the process 200a, a film material is optionally deposited on a wafer in the reaction chamber and on the protective coating. After the protective coating is deposited on surfaces of the plurality of chamber components, the wafer may be introduced into the reaction chamber for processing. The film material may be formed of a material different than a material of the protective coating. For example, the film material can include a metal, a metal oxide, a dielectric material, a semiconducting material, etc. In depositing the film material on the wafer, deposition of the film material may also occur on the surfaces of the plurality of chamber components. A thickness of the film material on the wafer may be greater than a thickness of the film material on surfaces of the plurality of chamber components.

At block 250 of the process 200a, the film material on the protective coating is optionally etched, where the film material is etched at a substantially greater rate than the protective coating. As used herein, a substantially greater rate may be an etch rate that is more than five times greater, more than ten times greater, or more than a hundred times greater. In some implementations, the film material may be etched from the wafer in addition to being etched from the surfaces of the plurality of chamber components. The film material may be etched using a halogen-based etchant, where the halogen-based etchant includes a fluorine-based species, a chlorine-based species, a bromine-based species, an iodine-based species, or combinations thereof. The halogen-based etchant may be used as part of a cleaning process to remove the film material from the reaction chamber. The film material has an etch selectivity that is different than the underlying protective coating. The etchant may be selective to the film material against the protective coating. In some implementations, an etch selectivity of the film material against the protective coating is greater than about 10:1 when exposed to the halogen-based etchant. That way, the protective coating may be preserved when cleaning films from the reaction chamber. In some implementations, an endpoint etch may be used to determine when the halogen-based etchant has completed etching the film material so that the protective coating is not etched. In some implementations, a composition of the protective coating may be selected depending on what kind of resistance is needed when the surfaces of the chamber components would be exposed to certain types of deposition or cleaning chemistries.

At block 260 of the process 200a, the protective coating is optionally re-deposited on the surfaces of the plurality of chamber components in the reaction chamber. After processing one or more wafers in the reaction chamber, the protective coating initially deposited at blocks 210 and 220 may degrade or erode over time. It will be appreciated that the protective coating may be deposited at the initial onset of usage of the reaction chamber or deposited/re-deposited on the surfaces of the plurality of chamber components after usage of the reaction chamber. In some implementations, the protective coating is re-deposited using the same processing conditions as described at blocks 210 and 220. This allows "healing" of the protective coating after using the reaction chamber. In some implementations, the protective coating is re-deposited on the surfaces of the plurality of chamber components after processing hundreds or thousands of wafers. In some implementations, re-depositing the protective coating may occur on a periodic basis and in an automated manner.

Figure 2B:
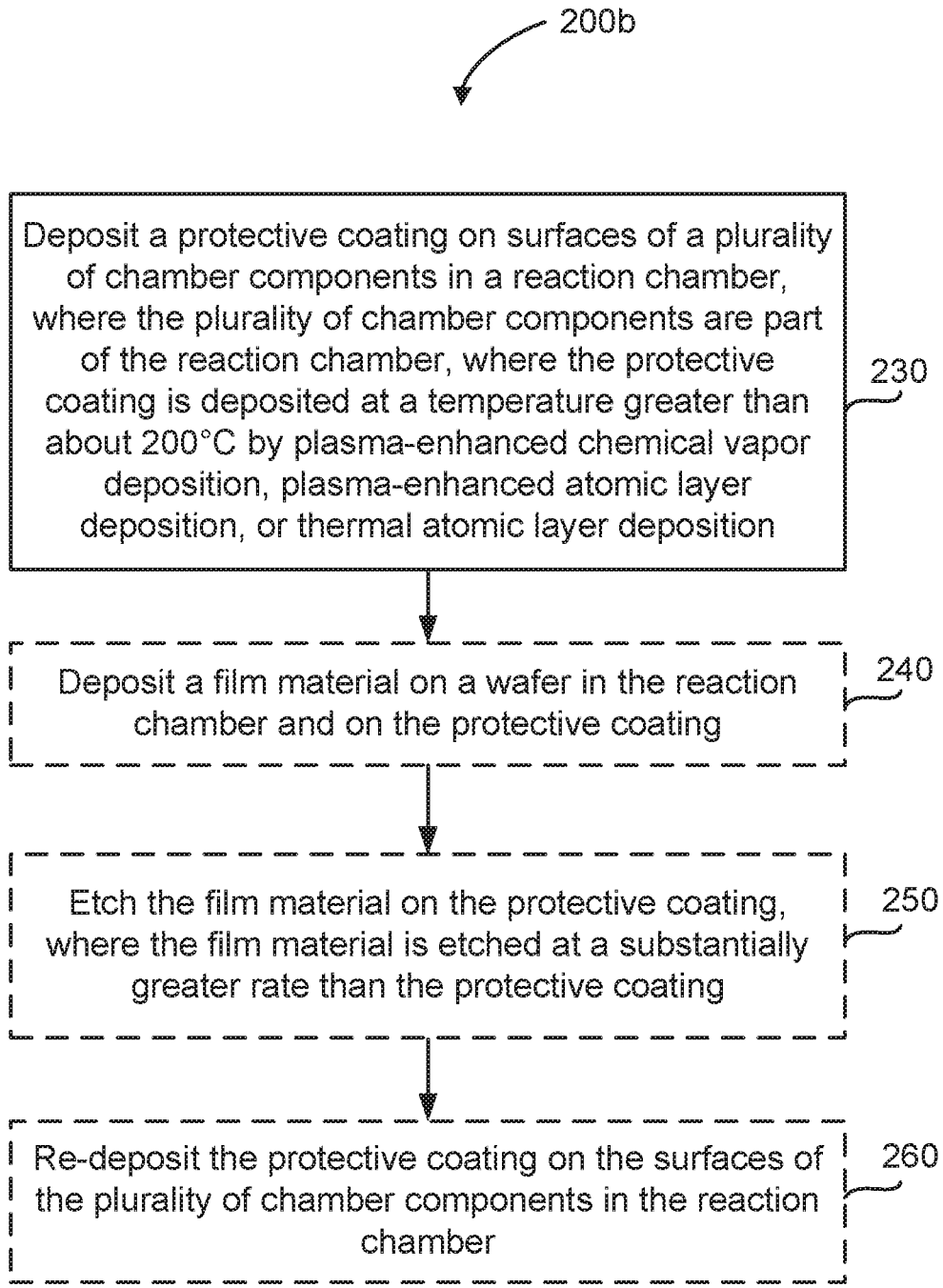
FIG. 2B shows a flow diagram of an example method of coating a plurality of chamber components in a reaction chamber according to some implementations.

FIG. 2B shows a flow diagram of an example method of coating a plurality of chamber components in a reaction chamber according to some implementations. Operations of a process 200b in FIG. 2B may include additional, fewer, or different operations.

At block 230 of the process 200b, a protective coating is deposited on surfaces of a plurality of chamber components in a reaction chamber, where the chamber components are part of the reaction chamber. The protective coating is deposited at a temperature greater than about 200° C. by plasma-enhanced chemical vapor deposition (PECVD), plasma-enhanced atomic layer deposition (PEALD), or thermal atomic layer deposition (thermal ALD). The protective coating may be deposited on surfaces of the plurality of chamber components with or without a wafer present in the reaction chamber. In some implementations, a thickness of the protective coating is between about 0.1 µm and about 4 µm, or between about 0.5 µm and about 3 µm, or between about 0.5 µm and about 2 µm.

Aspects of depositing the protective coating on the surfaces of the plurality of chamber components by PEALD and thermal ALD are described at blocks 210 and 220 in FIG. 2A. In implementations where PECVD is used, the protective coating may be deposited on the surfaces of the plurality of chamber components at a higher throughput compared to ALD techniques, but may not be able to achieve a higher conformality than ALD techniques.

In some implementations, the protective coating may be deposited at an elevated temperature greater than about 200° C., between about 225° C. and about 700° C., between about 250° C. and about 650° C., or between about 300° C. and about 600° C. The high temperature environment may be sustained during the reaction by ensuring that the reaction chamber reaches and maintains the elevated temperature, or at least by ensuring that chamber components such as a substrate support reaches and maintains the elevated temperature.

The protective coating may be resistant to at least some halogen-based chemistries, where halogen-based chemistries may include fluorine-based species (e.g., $F_2$, $NF_3$, $ClF_3$), chlorine-based species (e.g., $Cl_2$, $ClF_3$), bromine-based species (e.g., HBr), iodine-based species (e.g., $I_2$), or combinations thereof. Exposure to halogen-based chemistries may occur during deposition processes, etch processes, and/or cleaning processes. Halogen-based chemistries may include halogen-containing etchants, halogen-containing precursors, and halogen-containing byproducts. In some implementations, the etch rate of the protective coating is less than about 10 Å per minute, less than about 5 Å per minute, less than about 3 Å per minute, less than about 1 Å per minute, or between about 0.01 Å per minute and about 1 Å per minute when exposed to one or more halogen-based chemistries. The etch rate may vary depending on the type of halogen-based chemistry.

In some implementations, the protective coating includes an oxide, a nitride, a carbide, or combinations thereof. For example, the protective coating may include $SiO_2$, $Al_2O_3$, $ZrO_2$, $HfO_2$, $SnO_2$, or $Si_3N_4$. It will be appreciated that the protective coating is not limited to binary metal oxides, nitrides, or carbides, but may include other classes of materials that exhibit resistance to halogen-based chemistries. The etch rate of the protective coating depends on its composition and what chemistry the protective coating is exposed to.

The protective coating deposited in situ and according to processing conditions described herein may have a greater density, and hence a higher quality, than a coating deposited ex situ and/or according to different processing conditions, even if the coatings share identical composition. With an improved density, the protective coating may be substantially free of pinholes. The protective coating may last longer and is able to sustain thermal stress and plasma stress compared to coatings deposited ex situ and/or under different processing conditions.

In some implementations, the surfaces of the plurality of chamber components include exposed, internal surfaces of the plurality of chamber components in the reaction chamber. In some implementations, the plurality of chamber components include chamber walls, which may comprise sidewalls, floors, and ceilings of the reaction chamber. In some implementations, a plasma glow discharge may be generated in areas adjacent to the chamber walls of the reaction chamber to direct plasma towards the chamber walls. The plasma glow discharge may be generated in areas outside of a region between a showerhead and a pedestal of the reaction chamber.

In some embodiments, the plasma may be directed towards the chamber walls by controlling the phase between RF signals provided to each of a showerhead and a pedestal in the reaction chamber, or more generally between RF signals provided to each of an upper electrode and a lower electrode in the reaction chamber. Control of a phase difference between RF signals supplied to the upper electrode and the lower electrode assists in controlling the position of a plasma glow discharge generated in the reaction chamber. A phase difference between a first phase of the RF signal supplied to the upper electrode and a second phase of the RF signal supplied to the lower electrode may be between about 180 degrees out-of-phase and 0 degrees out-of-phase. For example, the phase difference between the upper electrode and the lower electrode may be substantially 0 degrees out-of-phase so that the plasma glow discharge is concentrated proximate the chamber walls.

In some implementations of the process 200b, a film material is deposited on the surfaces of the plurality of chamber components in the reaction chamber, where the film material is etched at a substantially greater rate than the protective coating during exposure to a fluorine-based etch, chlorine-based etch, bromine-based etch, or iodine-based etch. Depending on the deposition/etch/cleaning chemistries that the reaction chamber is expected to provide, multiple protective coatings may be selected to be deposited on the surfaces of the chamber components. One of the protective coatings may be resistant to a first etchant and another one of the protective coatings may be resistant to a second etchant. For example, the second protective coating may include $Al_2O_3$ to resist a chlorine-based etchant and the protective coating deposited at block 230 may include $ZrO_2$ to resist a fluorine-based etchant. It will be appreciated that additional protective coatings may be deposited on the surfaces of the plurality of chamber components depending on the deposition/etch/clean operations that are expected to be performed in the reaction chamber. Each of the protective coatings may be selected for its resistance to a particular chemistry.

As shown in the process 200b of FIG. 2B, blocks 240, 250, and 260 may be optionally performed after block 230. Aspects of blocks 240, 250, and 260 are described in the process 200a of FIG. 2A. A film material may be deposited on a wafer in the reaction chamber and on the protective coating at block 240. The film material on the protective coating may be etched at block 250, where the film material is etched at a substantially greater rate than the protective coating. The protective coating may be re-deposited on the surfaces of the plurality of chamber components in the reaction chamber at block 260.

Incomplete coverage of in situ protective coatings as described in the present disclosure may be avoided or otherwise mitigated by directing deposition onto the surfaces of the plurality of chamber components in the reaction chamber. More complete coverage can provide a more uniformly deposited protective coating that is not as porous as typical undercoats. In some implementations, more complete coverage can be achieved using an apparatus configured to control a position of a plasma glow discharge so that plasma is more directed to the surfaces of the plurality of chamber components. In some implementations where thermal ALD is provided, more complete coverage can be achieved using an apparatus configured to heat surfaces of the plurality of chamber components in a reaction chamber to an elevated temperature.

Figure 3A:
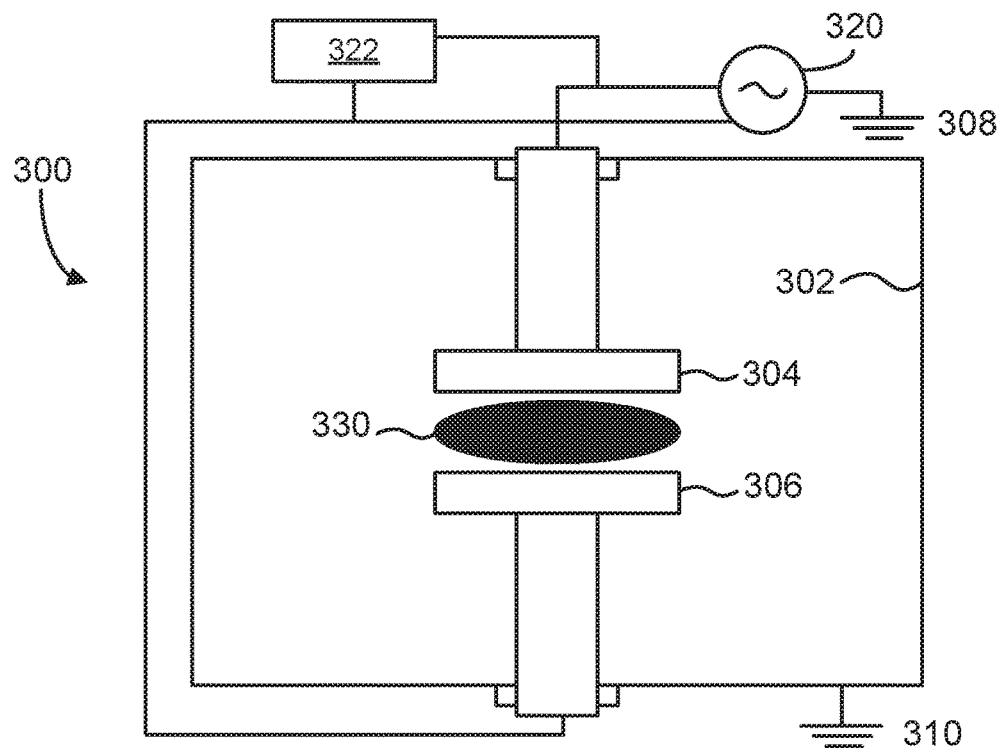
FIG. 3A illustrates a cross-sectional schematic of an example plasma apparatus with a reaction chamber, where a plasma glow discharge is generated between an upper and a lower electrode according to some implementations.
Figure 3B:
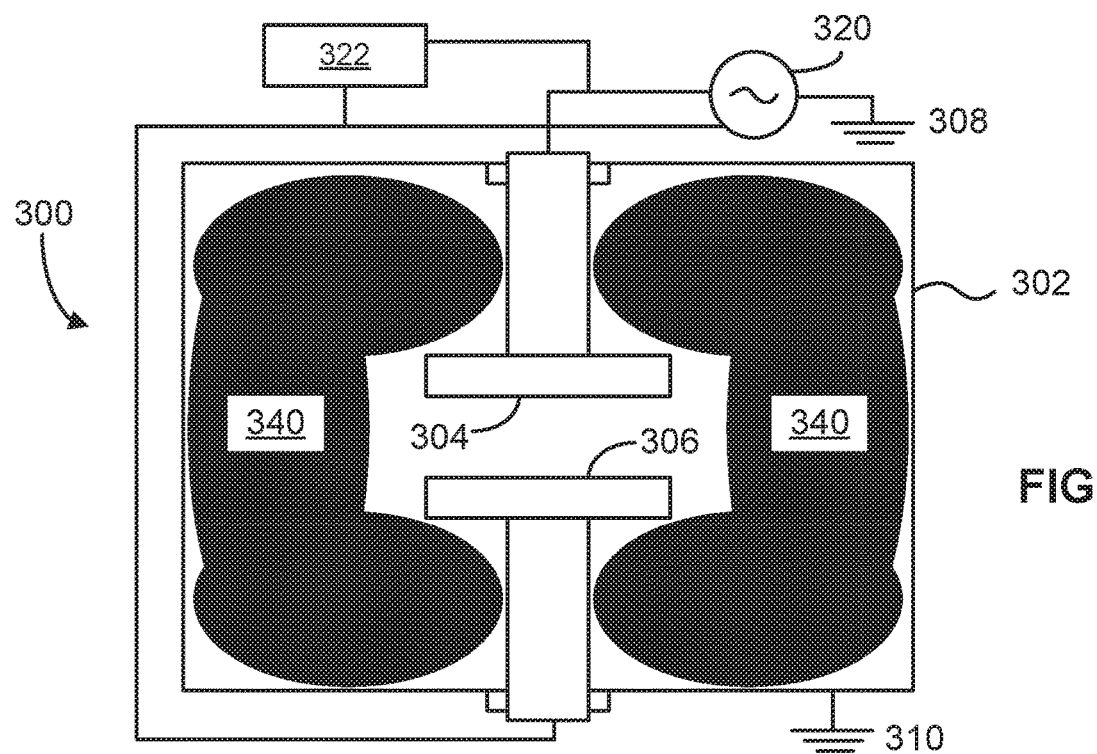
FIG. 3B illustrates a cross-sectional schematic of the example plasma apparatus with the reaction chamber of FIG. 3A, where a plasma glow discharge is generated adjacent to chamber walls of the reaction chamber according to some implementations.
Figure 3C:
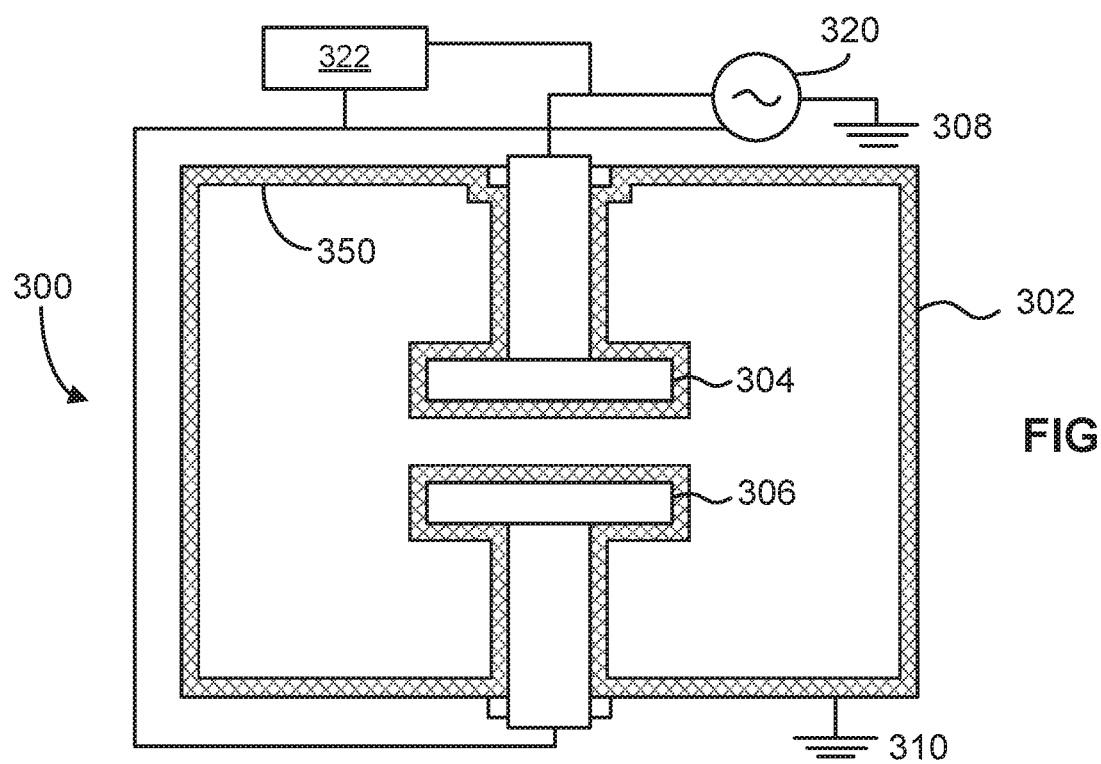
FIG. 3C illustrates a cross-sectional schematic of the example plasma apparatus with the reaction chamber of FIGS. 3A and 3B, where a protective coating is deposited on chamber walls of the reaction chamber according to some implementations.

FIGS. 3A-3C show an example plasma apparatus with a reaction chamber configured to direct plasma so that a protective coating is deposited on at least chamber walls of the reaction chamber. Aspects of such a plasma apparatus is described in more detail in U.S. patent application Ser. No. 15/786,497, filed Oct. 17, 2017, and titled "METHODS AND SYSTEMS FOR CONTROLLING PLASMA GLOW DISCHARGE IN A PLASMA CHAMBER," which is incorporated by reference in its entirety and for all purposes.

FIG. 3A illustrates a cross-sectional schematic of an example plasma apparatus with a reaction chamber, where a plasma glow discharge is generated between an upper electrode and a lower electrode according to some implementations. A reaction chamber 300 includes chamber walls 302. The chamber walls 302 may be grounded by an electrical ground 310. An upper electrode 304 may function as a showerhead for distributing process gases into the reaction chamber 300, and a lower electrode 306 may function as a pedestal for supporting a wafer in the reaction chamber 300. In some implementations, an RF power supply 320 is coupled at one of the electrodes 304, 306 and to ground 308, and is coupled to both the upper electrode 304 and the lower electrode 306 simultaneously. The RF power supply 320 may be connected to a controller 322, which may include a phase change control unit. The controller 322 may be configured to modify the phase of an RF signal being outputted by the RF power supply 320. In some implementations, the controller 322 may be configured to adjust a phase difference between a first phase supplied to the upper electrode 304 and a second phase supplied to the lower electrode 306. The position of a plasma glow discharge 330 may be influenced by the phase difference, where the phase difference can be anywhere between about 0 degrees out-of-phase and 180 degrees out-of-phase.

As shown in FIG. 3A, the reaction chamber 300 may provide a plasma glow discharge 330 concentrated between the upper electrode 304 and the lower electrode 306. In some implementations, the phase difference between the RF signal delivered to the upper electrode 304 and the lower electrode 306 may be substantially 180 degrees out-of-phase. Controlling the phase difference to be out-of-phase allows the plasma glow discharge 330 to be more contained between the upper electrode 304 and the lower electrode 306. However, by controlling the phase difference to be less than 180 degrees out-of-phase and closer to 0 degrees out-of-phase, the plasma glow discharge 330 may be shifted towards the chamber walls 302.

FIG. 3B illustrates a cross-sectional schematic of the example plasma apparatus with the reaction chamber of FIG. 3A, where a plasma glow discharge is generated adjacent to chamber walls of the reaction chamber according to some implementations. In the reaction chamber 300, a plasma glow discharge 340 is forced or shifted towards the chamber walls 302, which provide a path to the electrical ground 310. No plasma or substantially no plasma is ignited between the upper electrode 304 and the lower electrode 306, and the plasma is directed towards the electrical ground 310 of the chamber walls 302. Put another way, the plasma glow discharge 340 is positioned in a region outside an area adjacent to the lower electrode 306. In some implementations, the phase difference between the RF signal delivered to the upper electrode 304 and the lower electrode 306 may be substantially 0 degrees out-of-phase. In other words, the RF signal is delivered to the upper electrode 304 and the lower electrode 306 substantially in-phase. Controlling the phase difference to be in-phase allows the plasma glow discharge 340 to be adjacent to the chamber walls 302, which includes the sidewalls, floors, and ceilings of the reaction chamber 300.

FIG. 3C illustrates a cross-sectional schematic of the example plasma apparatus with the reaction chamber of FIGS. 3A and 3B, where a protective coating is deposited on chamber walls of the reaction chamber according to some implementations. By controlling the position of the plasma glow discharge 340 to be adjacent to the chamber walls 302, the plasma may be preferentially directed towards exposed, internal surfaces of a plurality of chamber components that includes the chamber walls 302. Such surfaces may include sidewalls, floors, ceilings, portions of a showerhead, portions of a substrate support, portions of lift pins, portions of gas lines, and/or portions of nozzles that may be otherwise difficult to expose to plasma. In some implementations, the plasma may be preferentially directed everywhere throughout the reaction chamber 300. Directing the plasma in such a manner allows deposition of protective coatings on exposed, internal surfaces of a plurality of chamber components that may otherwise be difficult to coat. This allows for more complete coverage of the protective coating 350 throughout the reaction chamber 300. As shown in FIG. 3C, a protective coating 350 is formed on chamber walls 302, on surfaces of the upper electrode 304, and on surfaces of the lower electrode 306. It will be appreciated that a thickness of the protective coating 350 on surfaces of the upper electrode 304 and the lower electrode 306 may be less than a thickness of the protective coating 350 on the chamber walls 302. The protective coating 350 is deposited in a high temperature environment that may be greater than about 200° C. The protective coating 350 is selective against various halogen-based chemistries. The protective coating 350 is a high quality in situ protective coating as described in the present disclosure.

Figure 4A:
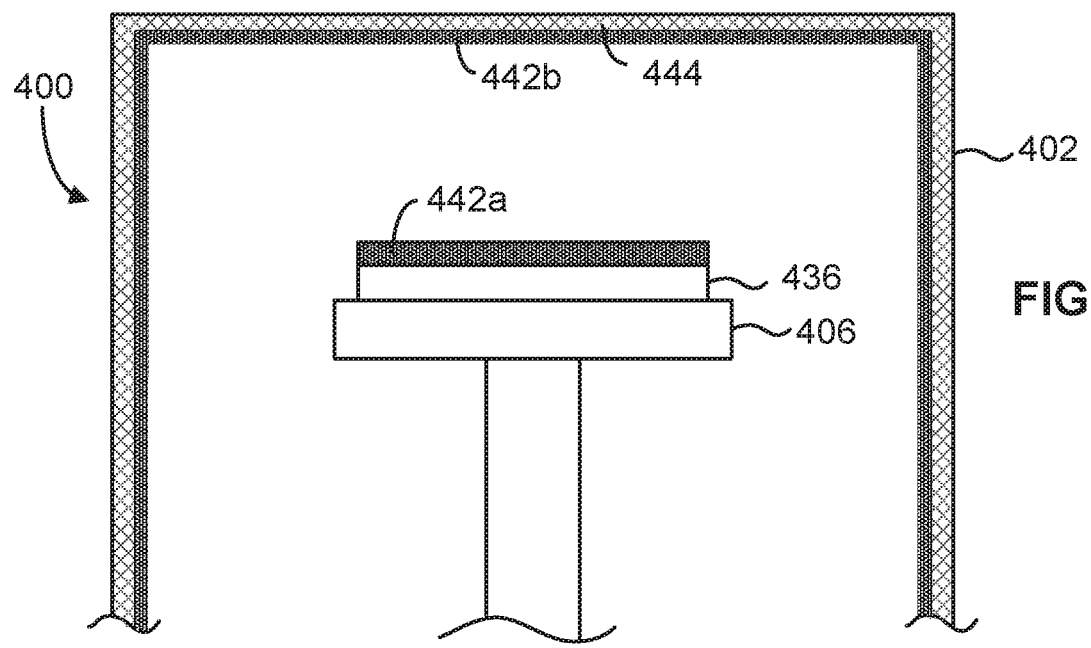
FIG. 4A illustrates a cross-sectional schematic of an example reaction chamber with a film material deposited on a wafer and the film material deposited on a protective coating according to some implementations.

FIG. 4A illustrates a cross-sectional schematic of an example reaction chamber with a film material deposited on a wafer and the film material deposited on a protective coating according to some implementations. The reaction chamber 400 includes chamber walls 402, where a protective coating 444 is deposited on the chamber walls 402. The protective coating 444 may be selected in terms of its etch selectivity to subsequent films being deposited in the reaction chamber 400 and in terms of what chemistries for depositing/etching/cleaning that the reaction chamber 400 will be exposed to. In FIG. 4A, a film material 442a is deposited on a wafer 436 that is supported on a pedestal 406. A film material 442b is also deposited on the chamber walls 402 and has the same composition as the film material 442a deposited on the wafer 436. In some implementations, the film material 442a, 442b includes a metal, metal oxide, dielectric material, or semiconducting material. The film material 442b deposited on the chamber walls 402 is disposed on the protective coating 444.

Figure 4B:
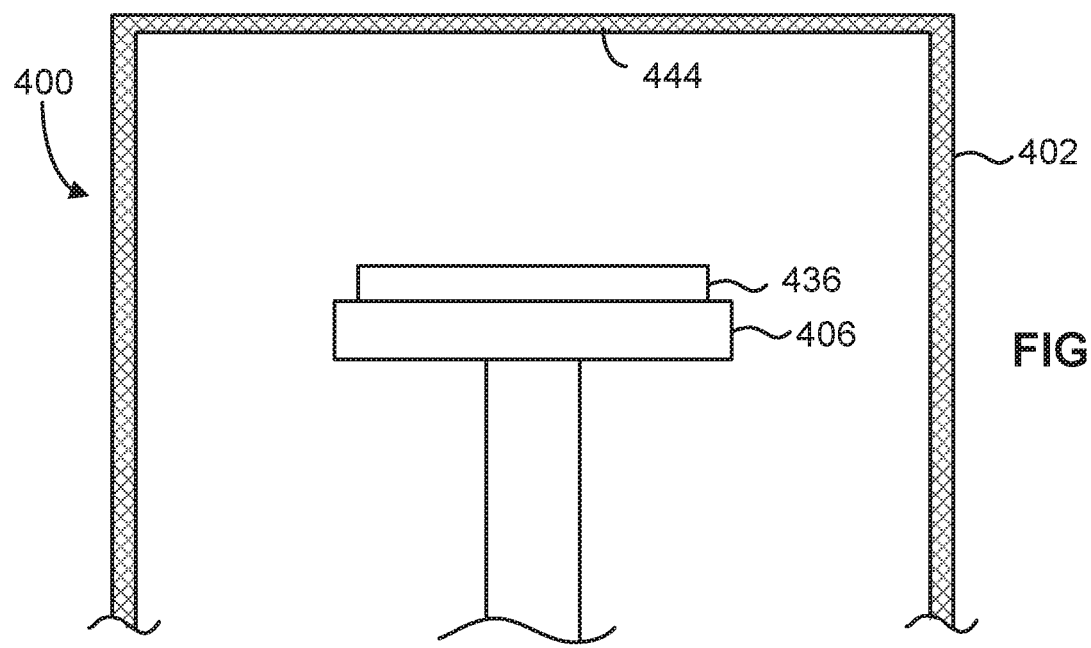
FIG. 4B illustrates a cross-sectional schematic of the example reaction chamber of FIG. 4A with the film material etched from the wafer and selectively etched from the protective coating according to some implementations.

FIG. 4B illustrates a cross-sectional schematic of the example reaction chamber of FIG. 4A with the film material etched from the wafer and selectively etched from the protective coating according to some implementations. The film material 442a is etched from the wafer 436, and the film material 442b on the chamber walls 402 is selectively etched so that the protective coating 444 is preserved on the chamber walls 402. In some implementations, a halogen-based etchant is used to perform the etch process, where the protective coating 444 is resistant to a chemistry of the halogen-based etchant. Accordingly, the film material 442b is etched at a substantially greater rate than the protective coating 444 during the etch process. The halogen-based etchant may be selected as part of an etch/clean operation for removing film material 442a, 442b from the reaction chamber 400, and the protective coating 444 may be selected to be resistant to the halogen-based etchant.

CONCLUSION

In the foregoing description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments are described in conjunction with the specific embodiments, it will be understood that it is not intended to limit the disclosed embodiments.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
   introducing a first reactant in a gas phase into a reaction chamber to adsorb onto surfaces of a plurality of chamber components, wherein the plurality of chamber components are part of the reaction chamber;
   introducing a second reactant in a gas phase into the reaction chamber;
   controlling a radio-frequency (RF) signal supplied to the reaction chamber to cause a portion of a plasma glow discharge of the second reactant to form in areas outside an area between an upper electrode and a lower electrode, wherein the first reactant and the second reactant react to deposit a first protective coating on the surfaces of the plurality of chamber components without a wafer present in the reaction chamber; and
   depositing a second protective coating on a surface of the wafer in the reaction chamber and on the first protective coating in the reaction chamber, wherein the second protective coating is etched at a substantially greater etch rate than the first protective coating when exposed to a fluorine-based species, a chlorine-based species, a bromine-based species, and/or an iodine-based species.

2. The method of claim 1, wherein a phase difference between a first phase of the RF signal supplied to the upper electrode and a second phase of the RF signal supplied to the lower electrode is between about 180 degrees out-of-phase and 0 degrees out-of-phase.

3. The method of claim 2, wherein the phase difference is about 0 degrees out-of-phase.

4. The method of claim 1, wherein the each of the first and second protective coating includes an oxide, a nitride, a carbide, or combinations thereof.

5. The method of claim 4, wherein the each of the first and second protective coating includes silicon oxide ($SiO_2$), aluminum oxide ($Al_2O_3$), zirconium oxide ($ZrO_2$), hafnium oxide ($HfO_2$), tin oxide ($SnO_2$), or silicon nitride ($Si_3N_4$).

6. The method of claim 1, wherein one or more materials of the plurality of chamber components include aluminum (Al).

7. The method of claim 1, wherein the plurality of chamber components include at least chamber walls of the reaction chamber.

8. The method of claim 1, further comprising:
etching the second protective coating on the surface of the wafer and on the first protective coating, wherein the second protective coating is etched at a substantially greater rate than the first protective coating so as to substantially preserve the first protective coating during etching.

9. The method of claim 8, wherein an etchant used for etching the second protective coating includes a fluorine-based species, a chlorine-based species, a bromine-based species, an iodine-based species, or combinations thereof.

10. The method of claim 8, further comprising:
re-depositing the first protective coating on the surfaces of the plurality of chamber components in the reaction chamber after etching the second protective coating.

11. The method of claim 1, wherein the first reactant reacts with the second reactant to deposit the first protective coating on the surfaces of the plurality of chamber components at a temperature between 450° C. and 650° C.

12. A method comprising:
depositing a first protective coating on surfaces of a plurality of chamber components in a reaction chamber without a wafer present in the reaction chamber, wherein the plurality of chamber components are part of the reaction chamber, wherein the first protective coating is deposited by plasma-enhanced chemical vapor deposition (PECVD) or plasma-enhanced atomic layer deposition (PEALD), wherein depositing the first protective coating by PEALD or PECVD comprises controlling a radio-frequency (RF) signal supplied to the reaction chamber to cause a portion of a plasma glow discharge to form in areas outside an area between an upper electrode and a lower electrode; and
depositing a second protective coating on a surface of the wafer in the reaction chamber and on the first protective coating in the reaction chamber, wherein the second protective coating is etched at a substantially greater etch rate than the first protective coating when exposed to a fluorine-based species, a chlorine-based species, a bromine-based species, and/or an iodine-based species.

13. The method of claim 12, further comprising:
re-depositing the first protective coating on the surfaces of the plurality of chamber components in the reaction chamber after exposure to the fluorine-based species, chlorine-based species, bromine-based species, or iodine-based species.

14. The method of claim 12, wherein a phase difference between a first phase of the RF signal supplied to the upper electrode and a second phase of the RF signal supplied to the lower electrode is about 0 degrees out-of-phase.

15. The method of claim 12, wherein the each of the first and second protective coating includes silicon oxide ($SiO_2$), aluminum oxide ($Al_2O_3$), zirconium oxide ($ZrO_2$), hafnium oxide ($HfO_2$), tin oxide ($SnO_2$), or silicon nitride ($Si_3N_4$), and wherein one or more materials of the plurality of chamber components include aluminum (Al).

* * * * *